(12) United States Patent
D'Evelyn

(10) Patent No.: US 8,871,024 B2
(45) Date of Patent: *Oct. 28, 2014

(54) HIGH PRESSURE APPARATUS AND METHOD FOR NITRIDE CRYSTAL GROWTH

(75) Inventor: Mark P. D'Evelyn, Goleta, CA (US)

(73) Assignee: Soraa, Inc., Fremont, CA (US)

( * ) Notice: Subject to any disclaimer, the term of this patent is extended or adjusted under 35 U.S.C. 154(b) by 923 days.

This patent is subject to a terminal disclaimer.

(21) Appl. No.: 13/013,697

(22) Filed: Jan. 25, 2011

(65) Prior Publication Data

US 2011/0183498 A1 Jul. 28, 2011

Related U.S. Application Data

(63) Continuation-in-part of application No. 12/133,364, filed on Jun. 5, 2008, now Pat. No. 8,097,081.

(60) Provisional application No. 61/073,687, filed on Jun. 18, 2008.

(51) Int. Cl.
*C30B 7/08* (2006.01)
*B01J 3/06* (2006.01)
*B01J 3/04* (2006.01)
*B01J 3/00* (2006.01)
*C30B 29/40* (2006.01)
*C30B 7/10* (2006.01)

(52) U.S. Cl.
CPC *B01J 3/008* (2013.01); *B01J 3/065* (2013.01); *B01J 3/042* (2013.01); *B01J 2203/067* (2013.01); *C30B 29/403* (2013.01); *C30B 7/10* (2013.01); *B01J 2203/0665* (2013.01); *B01J 2203/068* (2013.01); *C30B 29/406* (2013.01)
USPC ............ 117/68; 117/69; 117/70; 117/201

(58) Field of Classification Search
USPC ....................... 117/68, 69, 70, 201
See application file for complete search history.

(56) References Cited

U.S. PATENT DOCUMENTS

| | | |
|---|---|---|
| 3,245,760 A | 4/1966 | Sawyer |
| 3,303,053 A | 2/1967 | Strong et al. |
| 3,335,084 A | 8/1967 | Hall |
| 4,030,966 A | 6/1977 | Hornig et al. |

(Continued)

FOREIGN PATENT DOCUMENTS

| | | |
|---|---|---|
| CN | 101061570 | 10/2007 |
| JP | 2005-289797 A2 | 10/2005 |

(Continued)

OTHER PUBLICATIONS

USPTO Office Action for U.S. Appl. No. 13/472,356 dated Dec. 9, 2013 (11 pages).

(Continued)

*Primary Examiner* — Bob M Kunemund
(74) *Attorney, Agent, or Firm* — Kilpatrick Townsend & Stockton LLP

(57) ABSTRACT

An improved high pressure apparatus and methods for processing supercritical fluids is described. The apparatus includes a capsule, a heater, and at least one ceramic ring contained by a metal sleeve. The apparatus is capable of accessing pressures and temperatures of 0.2-2 GPa and 400-1200° C.

20 Claims, 6 Drawing Sheets

(56) References Cited

U.S. PATENT DOCUMENTS

| | | |
|---|---|---|
| 4,066,868 A | 1/1978 | Witkin et al. |
| 4,350,560 A | 9/1982 | Helgeland et al. |
| 4,430,051 A | 2/1984 | Von Platen |
| 5,098,673 A | 3/1992 | Engel et al. |
| 5,169,486 A | 12/1992 | Young et al. |
| 5,868,837 A | 2/1999 | DiSalvo et al. |
| 6,090,202 A | 7/2000 | Klipov |
| 6,129,900 A | 10/2000 | Satoh et al. |
| 6,152,977 A | 11/2000 | D'Evelyn |
| 6,273,948 B1 | 8/2001 | Porowski et al. |
| 6,350,191 B1 | 2/2002 | D'Evelyn et al. |
| 6,372,002 B1 | 4/2002 | D'Evelyn et al. |
| 6,398,867 B1 | 6/2002 | D'Evelyn et al. |
| 6,406,540 B1 | 6/2002 | Harris et al. |
| 6,406,776 B1 | 6/2002 | D'Evelyn |
| 6,455,877 B1 | 9/2002 | Ogawa et al. |
| 6,475,254 B1 | 11/2002 | Saak et al. |
| 6,528,427 B2 | 3/2003 | Chebi et al. |
| 6,533,874 B1 | 3/2003 | Vaudo et al. |
| 6,541,115 B2 | 4/2003 | Pender et al. |
| 6,596,040 B2 | 7/2003 | Saak et al. |
| 6,596,079 B1 | 7/2003 | Vaudo et al. |
| 6,639,925 B2 | 10/2003 | Niwa et al. |
| 6,656,615 B2 | 12/2003 | Dwilinski et al. |
| 6,686,608 B1 | 2/2004 | Takahira |
| 6,764,297 B2 | 7/2004 | Godwin et al. |
| 6,765,240 B2 | 7/2004 | Tischler et al. |
| 6,784,463 B2 | 8/2004 | Camras et al. |
| 6,787,814 B2 | 9/2004 | Udagawa |
| 6,806,508 B2 | 10/2004 | D'Evelyn et al. |
| 6,858,882 B2 | 2/2005 | Tsuda et al. |
| 6,861,130 B2 | 3/2005 | D'Evelyn et al. |
| 6,887,144 B2 | 5/2005 | D'Evelyn et al. |
| 6,936,488 B2 | 8/2005 | D'Evelyn et al. |
| 6,955,719 B2 | 10/2005 | Dmitriev et al. |
| 7,001,577 B2 | 2/2006 | Zimmerman et al. |
| 7,009,199 B2 | 3/2006 | Hall et al. |
| 7,009,215 B2 | 3/2006 | D'Evelyn et al. |
| 7,012,279 B2 | 3/2006 | Wierer, Jr. et al. |
| 7,026,755 B2 | 4/2006 | Setlur et al. |
| 7,026,756 B2 | 4/2006 | Shimizu et al. |
| 7,033,858 B2 | 4/2006 | Chai et al. |
| 7,053,413 B2 | 5/2006 | D'Evelyn et al. |
| 7,063,741 B2 | 6/2006 | D'Evelyn et al. |
| 7,067,407 B2 | 6/2006 | Kostamo et al. |
| 7,078,731 B2 | 7/2006 | D'Evelyn et al. |
| 7,098,487 B2 | 8/2006 | D'Evelyn et al. |
| 7,101,433 B2 | 9/2006 | D'Evelyn et al. |
| 7,102,158 B2 | 9/2006 | Tysoe et al. |
| 7,105,865 B2 | 9/2006 | Nakahata et al. |
| 7,112,829 B2 | 9/2006 | Picard et al. |
| 7,119,372 B2 | 10/2006 | Stokes et al. |
| 7,122,827 B2 | 10/2006 | Alizadeh et al. |
| 7,125,453 B2 | 10/2006 | D'Evelyn et al. |
| 7,160,388 B2 | 1/2007 | Dwilinski et al. |
| 7,160,531 B1 | 1/2007 | Jacques et al. |
| 7,170,095 B2 | 1/2007 | Vaudo et al. |
| 7,175,704 B2 | 2/2007 | D'Evelyn et al. |
| 7,198,671 B2 | 4/2007 | Ueda |
| 7,208,393 B2 | 4/2007 | Haskell et al. |
| 7,220,658 B2 | 5/2007 | Haskell et al. |
| 7,252,712 B2 | 8/2007 | Dwilinski et al. |
| 7,279,040 B1 | 10/2007 | Wang |
| 7,285,801 B2 | 10/2007 | Eliashevich et al. |
| 7,291,544 B2 | 11/2007 | D'Evelyn et al. |
| 7,316,746 B2 | 1/2008 | D'Evelyn et al. |
| 7,329,371 B2 | 2/2008 | Setlur et al. |
| 7,335,262 B2 | 2/2008 | Dwilinski et al. |
| 7,338,828 B2 | 3/2008 | Imer et al. |
| 7,358,542 B2 | 4/2008 | Radkov et al. |
| 7,364,619 B2 | 4/2008 | Dwilinski et al. |
| 7,368,015 B2 | 5/2008 | D'Evelyn et al. |
| 7,381,391 B2 | 6/2008 | Spencer et al. |
| 7,420,261 B2 | 9/2008 | Dwilinski et al. |
| 7,569,206 B2 | 8/2009 | Spencer et al. |
| 7,572,425 B2 | 8/2009 | McNulty et al. |
| 7,625,446 B2 | 12/2009 | D'Evelyn et al. |
| 7,642,122 B2 | 1/2010 | Tysoe et al. |
| 7,704,324 B2 | 4/2010 | D'Evelyn et al. |
| 7,705,276 B2 | 4/2010 | Giddings et al. |
| 7,759,710 B1 | 7/2010 | Chiu et al. |
| 7,871,839 B2 | 1/2011 | Lee et al. |
| 7,976,630 B2 | 7/2011 | Poblenz et al. |
| 8,021,481 B2 | 9/2011 | D'Evelyn |
| 8,048,225 B2 | 11/2011 | Poblenz et al. |
| 8,097,081 B2 * | 1/2012 | D'Evelyn ........................ 117/68 |
| 8,148,801 B2 | 4/2012 | D'Evelyn |
| 8,188,504 B2 | 5/2012 | Lee |
| 8,198,643 B2 | 6/2012 | Lee et al. |
| 8,207,548 B2 | 6/2012 | Nagai |
| 8,278,656 B2 | 10/2012 | Mattmann et al. |
| 8,284,810 B1 | 10/2012 | Sharma et al. |
| 8,299,473 B1 | 10/2012 | D'Evelyn et al. |
| 8,303,710 B2 | 11/2012 | D'Evelyn |
| 8,306,081 B1 | 11/2012 | Schmidt et al. |
| 8,323,405 B2 | 12/2012 | D'Evelyn |
| 8,329,511 B2 | 12/2012 | D'Evelyn |
| 8,354,679 B1 | 1/2013 | D'Evelyn et al. |
| 8,430,958 B2 | 4/2013 | D'Evelyn |
| 8,435,347 B2 | 5/2013 | D'Evelyn et al. |
| 8,444,765 B2 | 5/2013 | D'Evelyn |
| 8,461,071 B2 | 6/2013 | D'Evelyn |
| 8,465,588 B2 | 6/2013 | Poblenz et al. |
| 8,482,104 B2 | 7/2013 | D'Evelyn et al. |
| 8,492,185 B1 | 7/2013 | D'Evelyn et al. |
| 8,729,559 B2 | 5/2014 | Krames et al. |
| 2001/0009134 A1 | 7/2001 | Kim et al. |
| 2001/0011935 A1 | 8/2001 | Lee et al. |
| 2001/0048114 A1 | 12/2001 | Morita et al. |
| 2002/0070416 A1 | 6/2002 | Morse et al. |
| 2002/0105986 A1 | 8/2002 | Yamasaki |
| 2002/0182768 A1 | 12/2002 | Morse et al. |
| 2002/0189532 A1 | 12/2002 | Motoki et al. |
| 2003/0027014 A1 | 2/2003 | Johnson et al. |
| 2003/0140845 A1 | 7/2003 | D'Evelyn et al. |
| 2003/0145784 A1 | 8/2003 | Thompson et al. |
| 2003/0164507 A1 | 9/2003 | Edmond et al. |
| 2003/0183155 A1 | 10/2003 | D'Evelyn et al. |
| 2003/0209191 A1 | 11/2003 | Purdy |
| 2003/0232512 A1 | 12/2003 | Dickinson et al. |
| 2004/0000266 A1 | 1/2004 | D'Evelyn et al. |
| 2004/0023427 A1 | 2/2004 | Chua et al. |
| 2004/0104391 A1 | 6/2004 | Maeda et al. |
| 2004/0124435 A1 | 7/2004 | D'Evelyn et al. |
| 2004/0161222 A1 | 8/2004 | Niida et al. |
| 2004/0222357 A1 | 11/2004 | King et al. |
| 2004/0245535 A1 | 12/2004 | D'Evelyn et al. |
| 2005/0087753 A1 | 4/2005 | D'Evelyn et al. |
| 2005/0098095 A1 | 5/2005 | D'Evelyn et al. |
| 2005/0109240 A1 | 5/2005 | Maeta et al. |
| 2005/0121679 A1 | 6/2005 | Nagahama et al. |
| 2005/0128469 A1 | 6/2005 | Hall et al. |
| 2005/0152820 A1 | 7/2005 | D'Evelyn et al. |
| 2005/0167680 A1 | 8/2005 | Shei et al. |
| 2005/0191773 A1 | 9/2005 | Suzuki et al. |
| 2005/0205215 A1 | 9/2005 | Giddings et al. |
| 2005/0263791 A1 | 12/2005 | Yanagihara et al. |
| 2006/0030738 A1 | 2/2006 | Vanmaele et al. |
| 2006/0032428 A1 | 2/2006 | Dwilinski et al. |
| 2006/0037529 A1 | 2/2006 | D'Evelyn et al. |
| 2006/0037530 A1 | 2/2006 | Dwilinski et al. |
| 2006/0038193 A1 | 2/2006 | Wu et al. |
| 2006/0048699 A1 | 3/2006 | D'Evelyn et al. |
| 2006/0096521 A1 | 5/2006 | D'Evelyn et al. |
| 2006/0118799 A1 | 6/2006 | D'Evelyn et al. |
| 2006/0124051 A1 | 6/2006 | Yoshioka et al. |
| 2006/0163589 A1 | 7/2006 | Fan et al. |
| 2006/0169993 A1 | 8/2006 | Fan et al. |
| 2006/0177362 A1 | 8/2006 | D'Evelyn et al. |
| 2006/0207497 A1 | 9/2006 | D'Evelyn et al. |
| 2006/0213429 A1 | 9/2006 | Motoki et al. |
| 2006/0214287 A1 | 9/2006 | Ogihara et al. |
| 2006/0228870 A1 | 10/2006 | Oshima |
| 2006/0246687 A1 | 11/2006 | Kaiser et al. |

(56) References Cited

U.S. PATENT DOCUMENTS

| | | |
|---|---|---|
| 2006/0255343 A1 | 11/2006 | Ogihara et al. |
| 2006/0288927 A1 | 12/2006 | Chodelka et al. |
| 2006/0289386 A1 | 12/2006 | Tysoe et al. |
| 2007/0015345 A1 | 1/2007 | Baker et al. |
| 2007/0057337 A1 | 3/2007 | Kano et al. |
| 2007/0077674 A1 | 4/2007 | Okuyama et al. |
| 2007/0096239 A1 | 5/2007 | Cao et al. |
| 2007/0105351 A1 | 5/2007 | Motoki et al. |
| 2007/0114569 A1 | 5/2007 | Wu et al. |
| 2007/0121690 A1 | 5/2007 | Fujii et al. |
| 2007/0131967 A1 | 6/2007 | Kawaguchi et al. |
| 2007/0141819 A1 | 6/2007 | Park |
| 2007/0142204 A1 | 6/2007 | Park et al. |
| 2007/0151509 A1 | 7/2007 | Park |
| 2007/0158785 A1 | 7/2007 | D'Evelyn et al. |
| 2007/0164292 A1 | 7/2007 | Okuyama |
| 2007/0166853 A1 | 7/2007 | Guenther et al. |
| 2007/0178039 A1 | 8/2007 | D'Evelyn et al. |
| 2007/0181056 A1 | 8/2007 | D'Evelyn et al. |
| 2007/0190758 A1 | 8/2007 | Kaeding et al. |
| 2007/0197004 A1 | 8/2007 | Dadgar et al. |
| 2007/0210074 A1 | 9/2007 | Maurer et al. |
| 2007/0215033 A1 | 9/2007 | Imaeda et al. |
| 2007/0215887 A1 | 9/2007 | D'Evelyn et al. |
| 2007/0218703 A1 | 9/2007 | Kaeding et al. |
| 2007/0228404 A1 | 10/2007 | Tran et al. |
| 2007/0234946 A1 | 10/2007 | Hashimoto et al. |
| 2007/0252164 A1 | 11/2007 | Zhong et al. |
| 2007/0274359 A1 | 11/2007 | Takeuchi et al. |
| 2007/0290224 A1 | 12/2007 | Ogawa |
| 2008/0006831 A1 | 1/2008 | Ng |
| 2008/0008855 A1 | 1/2008 | D'Evelyn et al. |
| 2008/0023691 A1 | 1/2008 | Jang et al. |
| 2008/0025360 A1 | 1/2008 | Eichler et al. |
| 2008/0056984 A1 | 3/2008 | Yoshioka et al. |
| 2008/0073660 A1 | 3/2008 | Ohno et al. |
| 2008/0083741 A1 | 4/2008 | Giddings et al. |
| 2008/0083929 A1 | 4/2008 | Fan et al. |
| 2008/0083970 A1 | 4/2008 | Kamber et al. |
| 2008/0087919 A1 | 4/2008 | Tysoe et al. |
| 2008/0106212 A1 | 5/2008 | Yen et al. |
| 2008/0121906 A1 | 5/2008 | Yakushiji |
| 2008/0128752 A1 | 6/2008 | Wu |
| 2008/0156254 A1 | 7/2008 | Dwilinski et al. |
| 2008/0193363 A1 | 8/2008 | Tsuji |
| 2008/0198881 A1 | 8/2008 | Farrell et al. |
| 2008/0211416 A1 | 9/2008 | Negley et al. |
| 2008/0230765 A1 | 9/2008 | Yoon et al. |
| 2008/0272462 A1 | 11/2008 | Shimamoto |
| 2008/0282978 A1 | 11/2008 | Butcher et al. |
| 2008/0285609 A1 | 11/2008 | Ohta et al. |
| 2008/0298409 A1 | 12/2008 | Yamashita et al. |
| 2009/0078955 A1 | 3/2009 | Fan et al. |
| 2009/0092536 A1 | 4/2009 | Kawabata et al. |
| 2009/0146170 A1 | 6/2009 | Zhong et al. |
| 2009/0218593 A1 | 9/2009 | Kamikawa et al. |
| 2009/0250686 A1 | 10/2009 | Sato et al. |
| 2009/0301387 A1 | 12/2009 | D'Evelyn |
| 2009/0301388 A1 | 12/2009 | D'Evelyn |
| 2009/0309105 A1 | 12/2009 | Letts et al. |
| 2009/0309110 A1 | 12/2009 | Raring et al. |
| 2009/0320744 A1 | 12/2009 | D'Evelyn et al. |
| 2009/0320745 A1 | 12/2009 | D'Evelyn et al. |
| 2010/0001300 A1 | 1/2010 | Raring et al. |
| 2010/0003492 A1 | 1/2010 | D'Evelyn |
| 2010/0003942 A1 | 1/2010 | Ikeda et al. |
| 2010/0025656 A1 | 2/2010 | Raring et al. |
| 2010/0031872 A1 | 2/2010 | D'Evelyn |
| 2010/0031873 A1 | 2/2010 | D'Evelyn |
| 2010/0031874 A1 | 2/2010 | D'Evelyn |
| 2010/0031875 A1 | 2/2010 | D'Evelyn |
| 2010/0031876 A1 | 2/2010 | D'Evelyn |
| 2010/0032691 A1 | 2/2010 | Kim |
| 2010/0075175 A1 | 3/2010 | Poblenz et al. |
| 2010/0104495 A1 | 4/2010 | Kawabata et al. |
| 2010/0108985 A1 | 5/2010 | Chung et al. |
| 2010/0109030 A1 | 5/2010 | Krames et al. |
| 2010/0109126 A1 | 5/2010 | Arena |
| 2010/0117101 A1 | 5/2010 | Kim et al. |
| 2010/0117118 A1 | 5/2010 | Dabiran et al. |
| 2010/0147210 A1 | 6/2010 | D'Evelyn |
| 2010/0151194 A1 | 6/2010 | D'Evelyn |
| 2010/0189981 A1 | 7/2010 | Poblenz et al. |
| 2010/0219505 A1 | 9/2010 | D'Evelyn |
| 2010/0295088 A1 | 11/2010 | D'Evelyn et al. |
| 2011/0017298 A1 | 1/2011 | Lee |
| 2011/0062415 A1 | 3/2011 | Ohta et al. |
| 2011/0064103 A1 | 3/2011 | Ohta et al. |
| 2011/0100291 A1 | 5/2011 | D'Evelyn |
| 2011/0108081 A1 | 5/2011 | Werthen et al. |
| 2011/0121331 A1 | 5/2011 | Simonian et al. |
| 2011/0175200 A1 | 7/2011 | Yoshida |
| 2011/0220912 A1 | 9/2011 | D'Evelyn |
| 2011/0256693 A1 | 10/2011 | D'Evelyn et al. |
| 2011/0262773 A1 | 10/2011 | Poblenz et al. |
| 2012/0000415 A1 | 1/2012 | D'Evelyn et al. |
| 2012/0007102 A1 | 1/2012 | Feezell et al. |
| 2012/0025231 A1 | 2/2012 | Krames et al. |
| 2012/0073494 A1 | 3/2012 | D'Evelyn |
| 2012/0091465 A1 | 4/2012 | Krames et al. |
| 2012/0118223 A1 | 5/2012 | D'Evelyn |
| 2012/0119218 A1 | 5/2012 | Su |
| 2012/0137966 A1 | 6/2012 | D'Evelyn et al. |
| 2012/0187412 A1 | 7/2012 | D'Evelyn et al. |
| 2012/0199952 A1 | 8/2012 | D'Evelyn et al. |
| 2013/0119401 A1 | 5/2013 | D'Evelyn et al. |
| 2013/0251615 A1 | 9/2013 | D'Evelyn et al. |
| 2013/0323490 A1 | 12/2013 | D'Evelyn et al. |
| 2014/0065360 A1 | 3/2014 | D'Evelyn et al. |

FOREIGN PATENT DOCUMENTS

| | | |
|---|---|---|
| JP | 2007-039321 A | 2/2007 |
| WO | WO 2005121415 A1 | 12/2005 |
| WO | WO 2006/038467 | 4/2006 |
| WO | 2006/057463 | 6/2006 |
| WO | 2007/004495 | 1/2007 |
| WO | WO 2010/068916 | 6/2010 |
| WO | 2012/016033 | 2/2012 |

OTHER PUBLICATIONS

Copel et al., 'Surfactants in Epitaxial Growth', Physical Review Letters, Aug. 7, 1989, vol. 63, No. 6, p. 632-635.

Lu et al., 'Structure of the CI-passivated GaAs(111) surface', Physical Review B, Nov. 15, 1998, vol. 58, No. 20, pp. 13820-13823.

Massies et al., 'Surfactant mediated epitaxial growth of InxGa1-xAs on GaAs (001)', Applied Physics Letters, vol. 61, No. 1, Jul. 6, 1992, pp. 99-101.

Sumiya et al., 'High-pressure synthesis of high-purity diamond crystal', Diamond and Related Materials, 1996, vol. 5, pp. 1359-1365.

Communication from the Chinese Patent Office re 200980134876.2 dated Jul. 3, 2013, 14 pages.

Communication from the Polish Patent Office re P394857 dated Aug. 14, 2013, 2 pages.

USPTO Office Action for U.S. Appl. No. 12/133,365 dated Aug. 21, 2013, 29 pages.

USPTO Office Action for U.S. Appl. No. 12/334,418 dated Sep. 17, 2013, 27 pages.

USPTO Office Action for U.S. Appl. No. 12/497,969 dated Sep. 6, 2013, 21 pages.

USPTO Office Action for U.S. Appl. No. 12/636,683 dated Aug. 16, 2013, 16 pages.

USPTO Office Action for U.S. Appl. No. 12/697,171 dated Jun. 20, 2013, 17 pages.

USPTO Office Action for U.S. Appl. No. 12/697,171 dated Aug. 20, 2013, 17 pages.

USPTO Office Action for U.S. Appl. No. 13/272,981 dated Aug. 15, 2013, 13 pages.

Chiang et al. "Luminescent Properties of Cerium-Activated Garnet Series Phosphor: Structure and Temperature Effects," Journal of the Electrochemical Society 155:B517-B520 (2008).

(56) References Cited

OTHER PUBLICATIONS

Chiu et al. "Synthesis and Luminescence Properties of Intensely Red-Emitting $M5Eu(WO_4)_{4-x}(MoO_4)_x$ (M = Li, Na, K) Phosphors," Journal of the Electrochemical Society 15:J71-J78 (2008).
Ci et al. "$Ca_{1-x}Mo_{1-y}Nb_yO_4:Eu_x^{3+}$: A novel red phosphor for white light emitting diodes," Journal of Physics 152:670-674 (2008).
Happek "Development of Efficient UV-LED Phosphor Coatings for Energy Saving Solid State Lighting" University of Georgia (Jan. 2007).
Höppe et al. "Luminescence in $Eu^{2+}$-doped $Ba_2Si_5N_8$: fluorescence, thernoliminescence, and upconversion"; Journal of Physics and Chemistry of Solids 61:2001-2006 (2000).
Li et al. "The effect of replacement of Sr by Ca on the structural and luminescence properties of the red-emitting $Sr_2Si_5N_8:Eu_2+$ LED conversion phosphor," Journal of Solid State Chemistry 181:515-524 (2008).
Mueller-Mach et al. "Highly efficient all-nitride phosphor-converted white light emitting diode," Physica Status Solidi (a) 202:1727-1732 (Jul. 2005).
Setlur et al. "Crystal chemistry and luminescence of $Ce^{3+}$-doped $(Lu_2CaMg_2)$-Ca-2(Si, Ge)$_3O_{12}$ and its use in LED based lighting," Chemistry of Materials 18: 3314-3322 (2006).
Wang et al. "New red $Y_{0.85}Bi_{0.1}Eu_{0.05}V_{1-y}M_yO_4$ (M=Nb, P) phosphors for light-emitting diodes," Physica B: Condensed Matter 403:2071-2075 (Jun. 2008).
Yamamoto "White LED phosphors: the next step," Proceeding of . SPIE (2010).
Yang et al. "Preparation and luminescence properties of LED conversion novel phosphors $SrZnO_2:Sm$," Materials Letters 62:907-910 (Mar. 2008).
Office action for U.S. Appl. No. 12/497,969 (Feb. 2, 2012).
Office action for U.S. Appl. No. 12/478,736 (Feb. 7, 2012).
Office action for U.S. Appl. No. 12/569,841 (Dec. 23, 2011).
Office action for U.S. Appl. No. 12/724,983 (Mar. 5, 2012).
Office action for U.S. Appl. No. 12/785,404 (Mar. 6, 2012).
Office action for U.S. Appl. No. 12/491,176 (Mar. 1, 2012).
Fukuda et al. "Prospects for the ammonothermal growth of large GaN crystal," Journal of Crystal Growth 305: 304-310 (Jul. 2007).
Altoukhov et al., 'High reflectivity airgap distributed Bragg reflectors realized by wet etching of AlInN sacrificial layers', Applied Physics Letters, vol. 95, 2009, pp. 191102-1-191102-3.
Dorsaz et al., 'Selective oxidation of AlInN Layers for current confinement III-nitride devices', Applied Physics Letters, vol. 87, 2005, pp. 072102.
Ehrentraut et al., 'The ammonothermal crystal growth of gallium nitride—A technique on the up rise', Proceedings IEEE, 2010, 98(7), pp. 1316-1323.
Fang., 'Deep centers in semi-insulating Fe-doped native GaN substrates grown by hydride vapour phase epitaxy', Physica Status Solidi, vol. 5, No. 6, 2008, pp. 1508-1511.
Fujito et al., 'Development of bulk GaN crystals and nonpolar/semipolar substrates by HVPE', MRS Bulletin, 2009, 34, 5, pp. 313-317.
Gladkov et al., 'Effect of Fe doping on optical properties of freestanding semi-insulating HVPE GaN:Fe', Journal of Crystal Growth, 312, 2010, pp. 1205-1209.
Grzegory, 'High pressure growth of bulk GaN from Solutions in gallium', Journal of Physics Condensed Matter, vol. 13, 2001, pp. 6875-6892.
Moutanabbir, 'Bulk GaN Ion Cleaving', Journal of Electronic Materials, vol. 39, 2010, pp. 482-488.
Oshima et al., 'Thermal and optical properties of bulk GaN crystals fabricated through hydride vapor phase epitaxy with void-assisted separation', Journal of Applied Physics, 98, 2005, pp. 103509-1-103509-4.
International Search Report of PCT Application No. PCT/US2009/067745, dated Feb. 5, 2010, 1 page total.
Porowski, 'High Resistivity GaN Single Crystalline Substrates', Acta Physica Polonica A, vol. 92, No. 5, 1997, pp. 958-962.

Porowski, 'Near Defect Free GaN Substrates', Journal of Nitride Semiconductor, 1999, pp. 1-11.
Sharma et al., 'Verticaly oriented GaN-based air-gap distributed Bragg reflector structure fabricated using band-gap-selective photoelectrochemical etching', Applied Physics Letters, vol. 87, 2005, pp. 051107.
Tyagi et al., 'Partial Strain relaxation via misfit dislocation generation at heterointerfaces in (Al,In)GaN epitaxial layers grown on semipolar (1122) GaN free standing substrates', Applied Physics Letters 95, (2009) pp. 251905.
USPTO Office Action for U.S. Appl. No. 12/133,365 dated May 13, 2013.
USPTO Office Action for U.S. Appl. No. 12/497,969 dated May 16, 2013.
USPTO Office Action for U.S. Appl. No. 12/636,683 dated Jun. 12, 2013.
USPTO Office Action for U.S. Appl. No. 12/891,668 dated Jan. 10, 2013.
USPTO Notice of Allowance for U.S. Appl. No. 12/891,668 dated Mar. 20, 2013.
USPTO Notice of Allowance for U.S. Appl. No. 13/175,739 dated Mar. 21, 2013.
USPTO Office Action for U.S. Appl. No. 13/272,981 dated Mar. 20, 2013.
USPTO Office Action for U.S. Appl. No. 13/346,507 dated Dec. 21, 2012.
USPTO Notice of Allowance for U.S. Appl. No. 13/346,507 dated Apr. 22, 2013.
USPTO Notice of Allowance for U.S. Appl. No. 13/548,931 dated Jun. 3, 2013.
USPTO Office Action dated Nov. 26, 2010 for U.S. Appl. No. 12/133,364.
USPTO Office Action dated Jun. 1, 2011 for U.S. Appl. No. 12/133,364.
Byrappa et al., "Handbook of Hydrothermal Technology: A Technology for Crystal Growth and Materials Processing," Noyes Publications, Park Ridge, New Jersey, 2001, pp. 94-96 and 152.
Callahan et al., "Synthesis and Growth of Gallium Nitride by the Chemical Vapor Reaction Process (CVRP)," 1999, MRS Internet Journal Nitride Semiconductor Research, vol. 4, Issue No. 10, pp. 1-6.
D'Evelyn et al., "Bulk GaN Crystal Growth by the High-Pressure Ammonothermal Method," Journal of Crystal Growth, 2007, vol. 300, pp. 11-16.
Dwilinski et al, AMMONO Method of BN, AlN, and GaN Synthesis and Crystal Growth,: Journal of Nitride Semiconductor Research, 1998, 3,25, MRS, Internet: http://nsr.mij.mrs.org.
Dwilinski et al., "Excellent Crystallinity of Truly Bulk Ammonothermal GaN," Journal of Crystal Growth, 2008, vol. 310, pp. 3911-3916.
Ehrentraut et al., "Prospects for the Ammonothermal Growth of Large GaN Crystal," Journal of Crystal Growth, 2007, vol. 305, pp. 304-310.
Farrell et al., "Continuous-wave Operation of AlGaN-cladding-free Nonpolar m-Plane InGaN/GaN Laser Diodes," 2007, Japanese Journal of Applied Physics, vol. 46, No. 32, pp. L761-L763.
Feezell et al., "AlGaN-Cladding-Free Nonpolar InGaN/GaN Laser Diodes," Japanese Journal of Applied Physics, vol. 46, No. 13, pp. L284-L286.
Frayssinet et al., "Evidence of Free Carrier Concentration Gradient Along the c-axis for Undoped GaN Single Crystals," Journal of Crystal Growth, 2001, vol. 230, pp. 442-447.
Hashimoto et al. "Ammonothermal growth of bulk GaN," Journal of Crystal Growth 310:3907-3910 (Aug. 2008).
Hashimoto et al. "A GaN bulk crystal wit improved structural quality grown by the ammonothermal method," Nature Materials 6:568-671 (Jul. 2007).
Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.
Kim et al, "Improved Electroluminescence on Nonpolar m-plane InGaN/GaN Qantum Well LEDs", 2007, Physica Status Solidi (RRL), vol. 1, No. 3, pp. 125-127.

(56) References Cited

OTHER PUBLICATIONS

Kojima et al., "Stimulated Emission at 474 nm from an InGaN Laser Diode Structure Grown on a (1122) GaN Substrate ," 2007, Applied Physics Letter, vol. 91, No. 25, pp. 251107-251107-3.

Kolis et al., "Crystal Growth of Gallium Nitride in Supercritical Ammonia," Journal of Crystal Growth, 2001, vol. 222, pp. 431-434.

Kolis et al., "Materials Chemistry and Bulk Crystal Growth of Group III Nitrides in Supercritical Ammonia" Mat. Res. Soc. Symp. Proc., 1998, vol. 495, pp. 367-372.

Kubota et al., "Temperature Dependence of Polarized Photoluminescence from Nonpolar m-plane InGaN Multiple Quantum Wells for Blue Laser Diodes" 2008, Applied Physics Letter, vol. 92, pp. 011920-011920-3.

Mirwald et al., "Low-Friction Cell for Piston-Cylinder High Pressure Apparatus," Journal of Geophysical Research, 1975, vol. 80, No. 11, pp. 1519-1525.

Motoki et al. "Growth and Characterization of Freestanding GaN Substrates," Journal of Crystal Growth, 2002, vol. 237-239, pp. 912-921.

Murota et al., "Solid State Light Source Fabricated with YAG:Ce Single Crystal," 2002, Japanese Journal of Applied Physics, vol. 46, No. 41, Part 2, No. 8A, pp. L887-L888.

Okamoto et al., "Continuous-Wave Operation of m-Plane InGaN Multiple Quantum Well Laser Diodes," 2007, Japanese Journal of Applied Physics, vol. 46, No. 9, pp. L187-L189.

Okamoto et al., "Pure Blue Laser Diodes Based on Nonpolar m-Plane Gallium Nitride with InGaN Waveguiding Layers," 2007, Japanese Journal of Applied Physics, vol. 46, No. 35, pp. L820-L822.

Oshima et al., "Thermal and Optical Properties of Bulk GaN Crystals Fabricated Through Hydride Vapor Phase Epitaxy with Void-Assisted Separation," 2005, Journal of Applied Physics, vol. 98, pp. 103509-1-103509-3.

Peters, "Ammonothermal Synthesis of Aluminium Nitride," Journal of Crystal Growth, 1999, vol. 4, pp. 411-418.

Sarva et al. "Dynamic compressive strength of silicon carbide under uniaxial compression," Mat. Sci. & Eng. A 317,140 (2001).

Sato et al., "High Power and High Efficiency Green Light Emitting Diode on free-Standing Semipolar (1122) Bulk GaN Substrate," 2007.Physica Status Solidi (RRL), vol. 1, pp. 162-164.

Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.

Schmidt et al., "Demonstration of Nonpolar m-Plane InGaN/GaN Laser Diodes ," 2007, Japanese Journal of Applied Physics, vol. 46, No. 9, L190-L191.

Sizov et al., "500-nm Optical Gain Anisotropy of Semipolar (1122) InGaN Quantum Wells," 2009, Applied Physics Express, vol. 2, pp. 071001-1-071001-3.

Tsuda et al., "Blue Laser Diodes Fabricated on m-Plane GaN Substrates," 2008, Applied Physics Express, vol. 1, pp. 011104-011104-03.

Tyagi et al., "Semipolar (1011) InGaN/GaN Laser Diodes on Bulk GaN Substrates," 2007, Japanese Journal of Applied Physics, vol. 46, No. 19, pp. L444-L445.

Wang et al. "Ammonothermal growth of GaN crystals in alkaline solutions," Journal of crystal Growth 287:376-380 (Jan. 2006).

Wang et al., "Ammonothermal Synthesis of III-Nitride Crystals," Crystal Growth & Design, 2006, vol. 6, Issue No. 6, pp. 1227-1246.

Wang et al., "Synthesis of Dense Polycrystaline GaN of High Purity by the Chemical Vapor Reaction Process," Journal of Crystal Growth, 2006, vol. 286, pp. 50-54.

Zhong et al., "Demonstration of High Power Blue-Green Light Emitting Diode on Semipolar (1122) Bulk GaN Substrate," 2007, Electron Letter, vol. 43, No. 15, pp. 825-826.

Zhong et al., "High Power and High Efficiency Blue Light Emitting Diode on Freestanding Semipolar (1122) Bulk GaN Substrate," 2007, Applied Physics Letter, vol. 90, No. 23, pp. 233504-233504-3.

USPTO Notice of Allowance for U.S. Appl. No. 12/534,843 dated Jan. 24, 2013.

Communication from the Polish Patent Office re P394857 dated Jan. 22, 2013, 2 pages.

USPTO Notice of Allowance for U.S. Appl. No. 12/634,665 dated Feb. 15, 2013.

USPTO Office Action for U.S. Appl. No. 13/041,199 dated Mar. 12, 2013.

USPTO Notice of Allowance for U.S. Appl. No. 13/226,249 dated Feb. 21, 2013.

USPTO Office Action for U.S. Appl. No. 12/133,365 dated Feb. 20, 2014, 32 pages.

USPTO Office Action for U.S. Appl. No. 12/636,683 dated Feb. 24, 2014, 16 pages.

USPTO Notice of Allowance for U.S. Appl. No. 13/272,981 dated Mar. 13, 2014, 10 pages.

Choi et al., '2.51 microcavity InGaN light-emitting diodes fabricated by a selective dry-etch thinning process', Applied Physics Letters, 2007, 91(6), 061120.

Lide et al., 'Thermal Conductivity of Ceramics and Other Insulating Materials,' CRC Handbook of Chemistry and Physics, 91st Edition, 2010-2011, pp. 12-203 and 12-204.

http://www.matbase.com/material/non-ferrous-metals/other/molybdenum/properties, Data Table for: Non-Ferrous Metals: Other Metals: Molybdenum, Mar. 28, 2011, pp. 1.

Pattison et al., 'Gallium Nitride Based Microcavity Light Emitting Diodes With 2γ, Effective Cavity Thickness', Applied Physics Letters, vol. 90, Issue 3, 031111 (2007) 3pg.

Weisbuch et al., 'Recent results and latest views on microcavity LEDs', Light-Emitting Diodes: Research, Manufacturing, and Applications VIII, ed. By S.A. Stockman et al., Proc. SPIE, vol. 5366, p. 1-19 (2004).

USPTO Office Action for U.S. Appl. No. 12/133,365 dated Jun. 9, 2011.

USPTO Office Action for U.S. Appl. No. 12/133,365 dated Oct. 18, 2011.

USPTO Office Action for U.S. Appl. No. 12/334,418 dated Apr. 5, 2011.

USPTO Office Action for U.S. Appl. No. 12/334,418 dated Oct. 19, 2011.

USPTO Office Action for U.S. Appl. No. 12/478,736 dated Sep. 27, 2011.

USPTO Notice of Allowance for U.S. Appl. No. 12/478,736 dated Apr. 23, 2012.

USPTO Notice of Allowance for U.S. Appl. No. 12/478,736 dated Oct. 9, 2012.

USPTO Office Action for U.S. Appl. No. 12/484,095 dated Nov. 10, 2010.

USPTO Office Action for U.S. Appl. No. 12/484,095 dated Jul. 8, 2011.

USPTO Office Action for U.S. Appl. No. 12/497,969 dated Jul. 5, 2012.

USPTO Office Action for U.S. Appl. No. 12/534,838 dated May 3, 2011.

USPTO Office Action for U.S. Appl. No. 12/534,838 dated Jan. 13, 2012.

USPTO Office Action for U.S. Appl. No. 12/534,838 dated Mar. 20, 2012.

USPTO Notice of Allowance for U.S. Appl. No. 12/534,838 dated Jun. 8, 2012.

USPTO Office Action for U.S. Appl. No. 12/534,843 dated Sep. 10, 2012.

USPTO Office Action for U.S. Appl. No. 12/534,844 dated Sep. 16, 2010.

USPTO Office Action for U.S. Appl. No. 12/534,844 dated Feb. 4, 2011.

USPTO Notice of Allowance for U.S. Appl. No. 12/534,849 dated Jul. 31, 2012.

USPTO Office Action for U.S. Appl. No. 12/534,857 dated Sep. 1, 2010.

USPTO Notice of Allowance for U.S. Appl. No. 12/534,857 dated May 27, 2011.

USPTO Office Action for U.S. Appl. No. 12/546,458 dated Jul. 20, 2011.

(56) References Cited

OTHER PUBLICATIONS

USPTO Notice of Allowance for U.S. Appl. No. 12/546,458 dated Nov. 28, 2011.
USPTO Office Action for U.S. Appl. No. 12/556,558 dated Sep. 16, 2010.
USPTO Notice of Allowance for U.S. Appl. No. 12/556,558 dated Mar. 22, 2011.
USPTO Office Action for U.S. Appl. No. 12/556,562 dated Sep. 15, 2010.
USPTO Office Action for U.S. Appl. No. 12/556,562 dated Mar. 21, 2011.
USPTO Notice of Allowance for U.S. Appl. No. 12/556,562 dated Jul. 27, 2011.
USPTO Office Action for U.S. Appl. No. 12/569,337 dated May 9, 2012.
USPTO Notice of Allowance for U.S. Appl. No. 12/569,337 dated Nov. 15, 2012.
USPTO Office Action for U.S. Appl. No. 12/569,844 dated Oct. 12, 2012.
USPTO Office Action for U.S. Appl. No. 12/634,665 dated Apr. 25, 2012.
USPTO Office Action for U.S. Appl. No. 12/634,665 dated Oct. 1, 2012.
USPTO Notice of Allowance for U.S. Appl. No. 12/754,886 dated May 17, 2012.
USPTO Notice of Allowance for U.S. Appl. No. 12/754,886 dated Jun. 5, 2012.
USPTO Notice of Allowance for U.S. Appl. No. 12/754,886 dated Jun. 20, 2012.
USPTO Notice of Allowance for U.S. Appl. No. 12/785,404 dated Jul. 16, 2012.
USPTO Office Action for U.S. Appl. No. 12/891,668 dated Sep. 25, 2012.
USPTO Office Action for U.S. Appl. No. 13/025,833 dated Jul. 12, 2012.
USPTO Office Action for U.S. Appl. No. 13/041,199 dated Nov. 30, 2012.
USPTO Office Action for U.S. Appl. No. 13/175,739 dated Dec. 7, 2012.
USPTO Office Action for U.S. Appl. No. 13/179,346 dated Aug. 17, 2012.
USPTO Office Action for U.S. Appl. No. 13/179,346 dated Dec. 13, 2012.
USPTO Office Action for U.S. Appl. No. 13/226,249 dated Oct. 10, 2012.
USPTO Notice of Allowance for U.S. Appl. No. 13/425,304 dated Aug. 22, 2012.
International Search Report & Written Opinion of PCT Application No. PCT/US2009/046252, dated Jul. 29, 2009, 12 pages total.
Roder et al., 'Temperature dependence of the thermal expansion of GaN', Physics Review B, vol. 72., No. 085218, Aug. 24, 2005.
USPTO Notice of Allowance for U.S. Appl. No. 12/133,364 dated Oct. 11, 2011 (5 pages).
USPTO Office Action for U.S. Appl. No. 13/041,199 dated Apr. 29, 2014 (12 pages).

\* cited by examiner

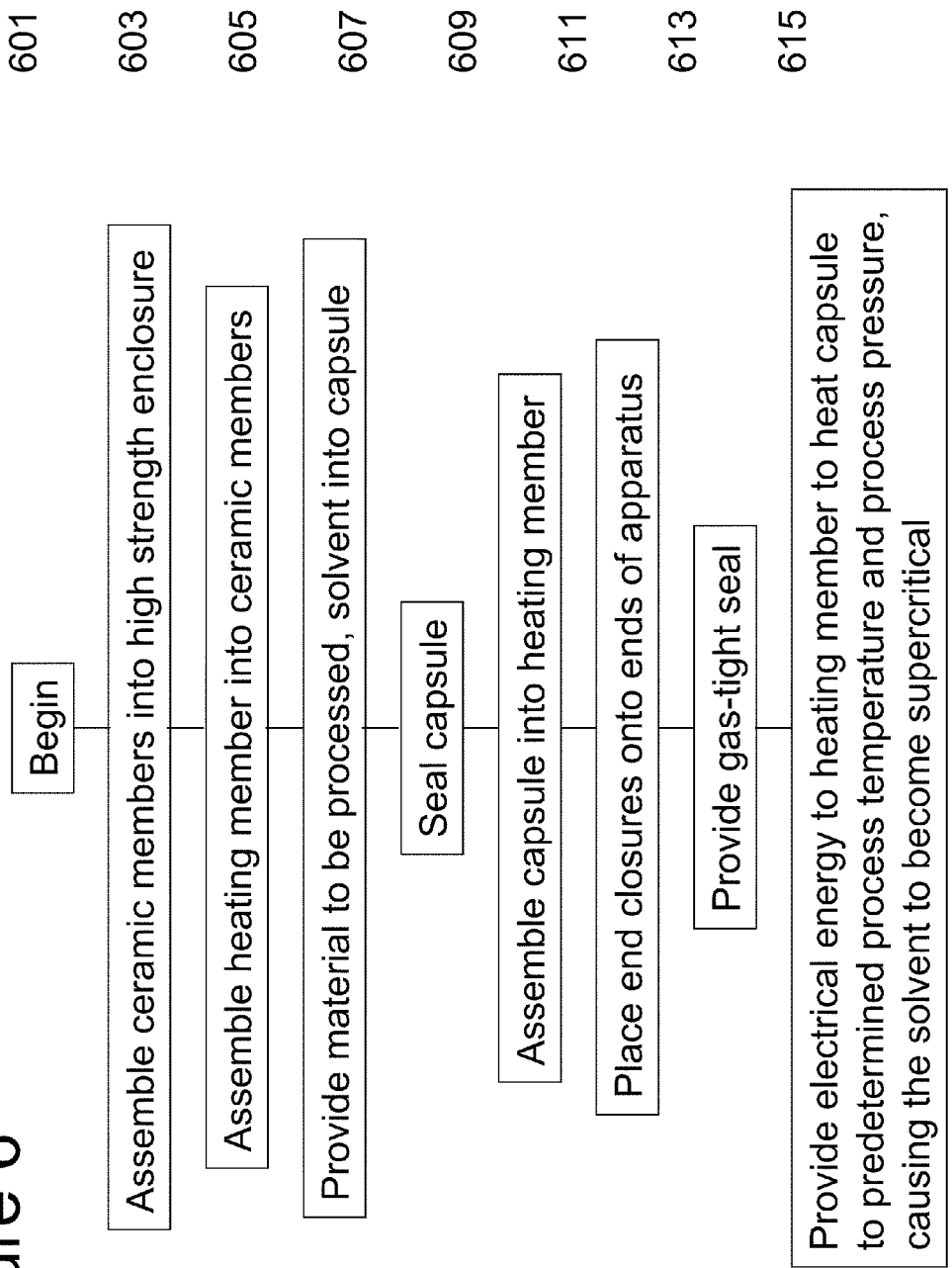

HIGH PRESSURE APPARATUS AND METHOD FOR NITRIDE CRYSTAL GROWTH

CROSS-REFERENCE TO RELATED APPLICATION

The present application is a continuation-in-part application claiming priority to U.S. patent application Ser. No. 12/133,364, filed Jun. 5, 2008, commonly owned and hereby incorporated by reference for all purposes.

BACKGROUND OF THE INVENTION

The present invention relates generally to techniques for processing materials in supercritical fluids. More specifically, embodiments of the invention include techniques for controlling parameters associated with a material processing capsule disposed within a high-pressure apparatus enclosure. The invention can be applied to growing crystals of GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photoelectrochemical water splitting and hydrogen generation, photodetectors, integrated circuits, and transistors, among other devices.

Supercritical fluids are used to process a wide variety of materials. A supercritical fluid is often defined as a substance beyond its critical point, i.e., critical temperature and critical pressure. A critical point represents the highest temperature and pressure at which the substance can exist as a vapor and liquid in equilibrium. In certain supercritical fluid applications, the materials being processed are placed inside a pressure vessel or other high pressure apparatus. In some cases it is desirable to first place the materials inside a container, liner, or capsule, which in turn is placed inside the high pressure apparatus. In operation, the high pressure apparatus provides structural support for the high pressures generated within the container or capsule holding the materials. The container, liner, or capsule provides a closed/sealed environment that is chemically inert and impermeable to solvents, solutes, and gases that may be involved in or generated by the process.

Scientists and engineers have been synthesizing crystalline materials using high pressure techniques. As an example, synthetic diamonds are often made using high pressure and temperature conditions. Synthetic diamonds are often used for industrial purposes but can also be grown large enough for jewelry and other applications. Scientists and engineers also use high pressure to synthesize complex materials such as zeolites, which can be used to filter toxins and the like. Moreover, geologists have also used high pressure techniques to simulate conditions and/or processes occurring deep within the earth's crust. High pressure techniques often rely upon supercritical fluids, herein referred to as SCFs.

Supercritical fluids provide an especially ideal environment for growth of high quality crystals in large volumes and low costs. In many cases, supercritical fluids possess the solvating capabilities of a liquid with the transport characteristics of a gas. Thus, on the one hand, supercritical fluids can dissolve significant quantities of a solute for recrystallization. On the other hand, the favorable transport characteristics include a high diffusion coefficient, so that solutes may be transported rapidly through the boundary layer between the bulk of the supercritical fluid and a growing crystal, and also a low viscosity, so that the boundary layer is very thin and small temperature gradients can cause facile self-convection and self-stirring of the reactor. This combination of characteristics enables, for example, the growth of hundreds or thousands of large a-quartz crystals in a single growth run in supercritical water.

Supercritical fluids also provide an attractive medium for synthesis of exotic materials, such as zeolites, for solvent extractions, as of caffeine from coffee, and for decomposition and/or dissolution of materials that are relatively inert under more typical conditions, such as biofuels and toxic waste materials.

In some applications, such as crystal growth, the pressure vessel or capsule also includes a baffle plate that separates the interior into different chambers, e.g., a top half and a bottom half. The baffle plate typically has a plurality of random or regularly spaced holes to enable fluid flow and heat and mass transfer between these different chambers, which hold the different materials being processed along with a supercritical fluid. For example, in typical crystal growth applications, one portion of the capsule contains seed crystals and the other half contains nutrient material. In addition to the materials being processed, the capsule contains a solid or liquid that forms the supercritical fluid at elevated temperatures and pressures and, typically, also a mineralizer to increase the solubility of the materials being processed in the supercritical fluid. In other applications, for example, synthesis of zeolites or of nanoparticles or processing of ceramics, no baffle plate may be used for operation. In operation, the capsule is heated and pressurized toward or beyond the critical point, thereby causing the solid and/or liquid to transform into the supercritical fluid. In some applications the fluid may remain subcritical, that is, the pressure or temperature may be less than the critical point. However, in all cases of interest here, the fluid is superheated, that is, the temperature is higher than the boiling point of the fluid at atmospheric pressure. The term "supercritical" will be used throughout to mean "superheated," regardless of whether the pressure and temperature are greater than the critical point, which may not be known for a particular fluid composition with dissolved solutes.

Although somewhat effective for conventional crystal growth, drawbacks exist with conventional processing vessels. As an example, processing capabilities for conventional steel hot-wall pressure vessels (e.g., autoclaves) are typically limited to a maximum temperature of about 400 Degrees Celsius and a maximum pressure of 0.2 GigaPascals (GPa). Fabrication of conventional pressure vessels from nickel-based superalloys allows for operation at a maximum temperature of about 550 degrees Celsius and a maximum pressure of about 0.5 GPa. Therefore, these conventional hot-wall pressure vessels are often inadequate for some processes, such as the growth of gallium nitride crystals in supercritical ammonia that often require pressures and temperatures that extend significantly above this range in order to achieve growth rates above about 2-4 microns per hour. In addition, nickel-based superalloys are very expensive and are difficult to machine, limiting the maximum practical size and greatly increasing the cost compared to traditional steel pressure vessels.

Attempts have been made to overcome the drawbacks of conventional pressure vessels. D'Evelyn et al., US patent application 2003/0140845A1, indicates a so-called zero-stroke high pressure apparatus adapted from the type of belt apparatus used for synthesis of diamond using high pressure and high temperature. Cemented tungsten carbide, however, is used as the die material, which is relatively expensive and is difficult to manufacture in large dimensions. In addition, the use of a hydraulic press to contain the apparatus increases the cost and further limits the maximum volume. Finally, the use of a pressure transmission medium surrounding the capsule used to contain the supercritical fluid reduces the volume available within the hot zone for processing material.

D'Evelyn et al., US patent application 2006/0177362A1, indicates several types of apparatus with capability for pressures and temperatures well in excess of that of conventional autoclaves and with improved scalability relative to the zero-stroke press apparatus described above. An internally-heated gas pressure apparatus circumvents the pressure-temperature limitations of conventional hot-wall pressure vessels. However, gas pressure vessels are generally not available in large sizes for pressure ratings substantially above 2000, 3000, or 5000 bar. In an alternative apparatus, a series of wedge-shaped radial ceramic segments are placed between a heater which surrounds a capsule and a high-strength enclosure, in order to reduce both the pressure and temperature to which the inner diameter of the high-strength enclosure is exposed compared to the corresponding values for the capsule. However, this apparatus requires non-standard heaters, and adventitious gaps within the apparatus may give rise to undesirable deformation of the capsule.

D'Evelyn in U.S. patent application 2009/0301387A1 teaches an alternative internally-heated apparatus in which expensive-to-fabricate wedge-shaped radial ceramic segments are replaced by continuous annular ceramic members. However, this apparatus similarly requires non-standard heaters, and adventitious gaps within the apparatus may give rise to undesirable deformation of the capsule.

BRIEF SUMMARY OF THE INVENTION

This invention includes techniques for controlling parameters associated with a material processing capsule disposed within a high-pressure apparatus/enclosure. The invention can be applied to growing crystals of GaN, AlN, InN, InGaN, AlGaN, and AlInGaN, as well as others, for manufacture of bulk or patterned substrates. Such bulk or patterned substrates can be used for a variety of applications including optoelectronic devices, lasers, light emitting diodes, solar cells, photo electrochemical water splitting and hydrogen generation, photodetectors, integrated circuits, and transistors.

In a specific embodiment, the invention provides a high pressure apparatus and related methods for processing supercritical fluids. The apparatus includes a capsule, a heater, at least one ceramic ring, with one or more scribe marks and/or cracks present. Optionally, the apparatus includes a metal sleeve containing each ceramic ring. The apparatus also has a high-strength enclosure, end flanges with associated insulation, and a power control system. The apparatus is scalable up to very large volumes and is cost effective. The apparatus is capable of accessing pressures and temperatures of 0.2-2 GPa and 400-1200° C., respectively. As used herein "high-strength" generally means suitable mechanical and other features (e.g., tensile strength, Young's Modulus, yield strength, toughness, creep resistance, chemical resistance) that allow use as a high pressure enclosure, such as a pressure vessel, which also may be airtight. "High pressure" generally refers to above 0.1 GPa, 0.2 GPa, 0.5 GPa, and, particularly to pressures suitable for growth of crystalline materials, including GaN, AlN, InN, AlGaN, InGaN, AlInGaN, and other nitrides or oxides or metal or dielectric or semiconducting materials. The high strength enclosure material enables an enclosure that can withstand a load of greater than about 0.1 GPa (or 0.2 GPa or 0.5 GPa) at a temperature of about 200 Degrees Celsius.

The invention provides apparatus for high pressure crystal or material processing, e.g., GaN, AlN, InN, InGaN, AlGaN, and AlInGaN. The apparatus includes a cylindrical capsule region comprising a first region and a second region, and a length defined between the first region and the second region. An annular heating member encloses the cylindrical capsule region, and at least one continuous annular ceramic (or metal or cermet) member is disposed continuously around a perimeter of the annular heating member. Preferably, the continuous annular member is made of a material having a compressive strength of about 0.5 GPa and greater and a thermal conductivity of about 4 watts per meter-Kelvin and less. In a specific embodiment, the apparatus has a high strength enclosure material disposed overlying the annular ceramic member.

The invention also provides a method of crystal growth, e.g., GaN, AlN, InN, InGaN, AlGaN, and AlInGaN. The method includes processing the capsule with thermal energy to cause an increase in temperature within the capsule to greater than 200 Degrees Celsius to cause the solvent to be superheated. The method can also includes optional steps in which a crystalline material is formed from using the superheated solvent. Additionally, the method includes removing thermal energy from the capsule to lower the temperature of the capsule from a first temperature to a second temperature. The method also includes removing a first flange and a second flange from the high pressure apparatus and moving a mechanical member, using a hydraulic drive force, from the first region of the cylindrical capsule region toward the second region to transfer the capsule out of the cylindrical capsule region. In a preferred embodiment, the present apparatus can be scaled up in size to a capsule volume of 0.3 liters, to about 300 liters, and greater.

The present invention enables a cost-effective high pressure apparatus for growth of crystals such as GaN, AlN, InN, InGaN, and AlInGaN. In a specific embodiment, the present method and apparatus operates with components that are relatively simple and cost effective to manufacture, such as ceramic and steel tubes. A specific embodiment also takes advantage of the one or more cracks provided in the ceramic member, which insulates the heater. Depending upon the embodiment, the present apparatus and method can be manufactured using conventional materials and/or methods according to one of ordinary skill in the art. The present apparatus and method enable cost-effective crystal growth and materials processing under extreme pressure and temperature conditions.

BRIEF DESCRIPTION OF THE DRAWINGS

FIG. 6 is a simplified flow diagram of a method of processing a material within a supercritical fluid.

DETAILED DESCRIPTION OF THE INVENTION

The invention provides a high pressure apparatus for processing materials which may be vertically, horizontally or obliquely oriented. The apparatus may be rocked so as to facilitate convection of the supercritical fluid within the capsule.

Figure 1:
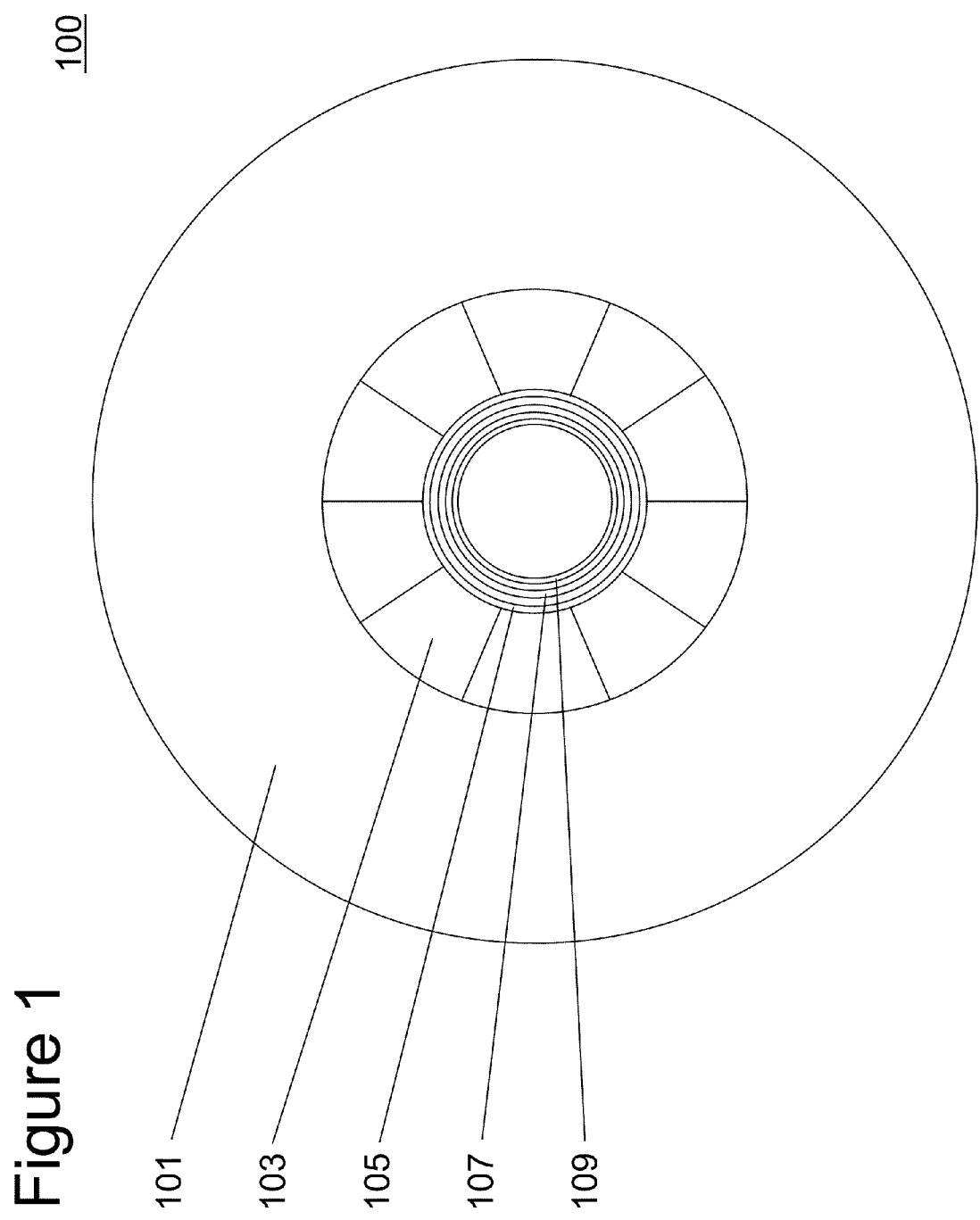
FIG. 1 is a cross-sectional view of a high pressure apparatus according to an embodiment of the invention.

A cross-sectional view of a high-pressure apparatus 100 is shown schematically in FIG. 1. A capsule or liner 109 is placed within a heater 107, which in turn is placed within a sleeve 105, a plurality of radial segments 103, and a high strength enclosure 101. In some embodiments capsule 109 is sealed prior to placement in the high-pressure apparatus, as described in U.S. Pat. No. 7,125,453 or U.S. Patent Application No. 2009/0301388A1, each of which is incorporated by reference herein. In other embodiments, a liner 109 is used that is unsealed until being placed in high-pressure apparatus 100. The capsule or liner preferably includes copper, copper-based alloy, gold, silver, palladium, platinum, iridium, ruthenium, rhodium, osmium, titanium, vanadium, chromium, iron, iron-based alloy, nickel, nickel-based alloy, zirconium, niobium, molybdenum, tantalum, tungsten, rhenium, or combinations thereof. Capsule or liner 109 may have a thickness between about 0.010" and about 0.125", or between about 0.015" and about 0.065".

In some embodiments, a dense, incompressible heater, such as that described in U.S. Patent Application No. 2008/0083741A1 or in U.S. Patent Application No. 2009/0320745A1, each of which is incorporated by reference herein, is employed. In other embodiments, a conventional heater is employed, such as a cartridge heater, a tubular heater, a cable heater, a ribbon heater, a spiral heater, a coil heater, or the like. Sleeve 105 preferably comprises iron, iron-based alloy or superalloy, steel, stainless steel, nickel, nickel-based alloy or superalloy, cobalt, cobalt-based alloy or superalloy, or a precipitation-hardening alloy. In a specific embodiment, sleeve 105 is made of a material selected from a group consisting of steel, low-carbon steel, SA723 steel, SA266 carbon steel, 4340 steel, A-286 steel, iron based super-alloy, 304 stainless steel, 310 stainless steel, 316 stainless steel, 340 stainless steel, 410 stainless steel, 17-4 precipitation hardened stainless steel, zirconium and its alloys, titanium and its alloys, and other materials commonly known as Monel, Inconel 718, Hastelloy, Waspalloy, ATI 718Plus, IN-100, Inconel 792, IN 939, Nimonic 115, Udimet 500, Udimet 520, Udimet 720, IN 738, Mar M-247, CM 681 LC, B-1900/PWA 663, Stellite, Rene 41, Rene 77, and Rene 88. These components are contained within high-strength enclosure 101, which may be fabricated from SA 723 pressure vessel steel.

A plurality of radial segments 103 may be positioned between the high strength enclosure 101 and the liner 105. These radial segments may be disposed one after another around a circumference of the liner, such that each radial segment is a wedge-shaped portion of a segmented cylinder. The radial segment may comprise a ceramic, such as alumina, silicon nitride, silicon carbide, zirconia, or the like. The radial segment may alternatively comprise a refractory metal, such as tungsten, molybdenum, or TZM alloy, or a cermet, such as Co-cemented tungsten carbide. Radial clearances greater than 0.002", greater than 0.005", greater than 0.010", or greater than 0.020", may be provided between the outer diameter of capsule or liner 109 and the inner diameter of heater 107 and between the outer diameter of heater 107 and the inner diameter of sleeve 105. Heater 107 may contact one or both of capsule or liner 109 and sleeve 105 but may be slidingly insertable within sleeve 105 and capsule or liner 109 may similarly be slidingly insertable within heater 107.

Figure 2:
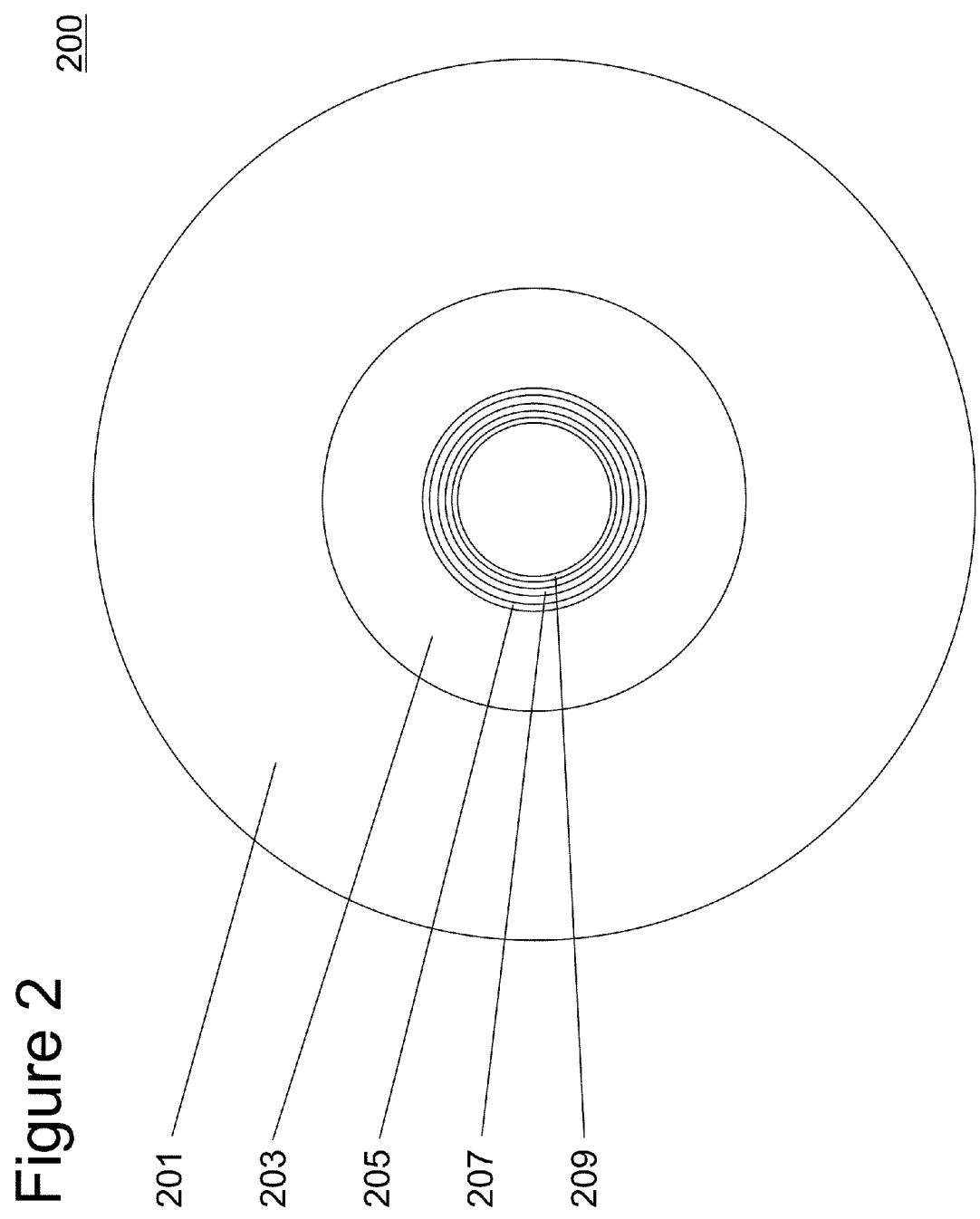
FIG. 2 is a cross-sectional view of a high pressure apparatus according to another embodiment of the invention.

A cross-sectional view of alternative high-pressure apparatus 200 is shown in FIG. 2. A capsule or liner 209 is placed within a heater 207, which in turn is placed within a sleeve 205, a continuous annular member 203, and a high strength enclosure 201. In some embodiments capsule 209 is sealed prior to placement in the high-pressure apparatus, while in other embodiments, a liner 209 is used that is unsealed until being placed in high pressure apparatus 200. The continuous annular member 203 comprises a ceramic, such as alumina, silicon nitride, silicon carbide, zirconia, or the like. The continuous annular member 203 may alternatively comprise a refractory metal, such as tungsten, molybdenum, or TZM alloy, or a cermet, such as Co-cemented tungsten carbide. Radial clearances greater than 0.002", greater than 0.005", greater than 0.010", or greater than 0.020", may be provided between the outer diameter of capsule or liner 109 and the inner diameter of heater 107 and between the outer diameter of heater 107 and the inner diameter of sleeve 105. Heater 107 may contact one or both of capsule or liner 109 and sleeve 105 but may be slidingly insertable within sleeve 105 and capsule or liner 109 may similarly be slidingly insertable within heater 107.

Figure 3:
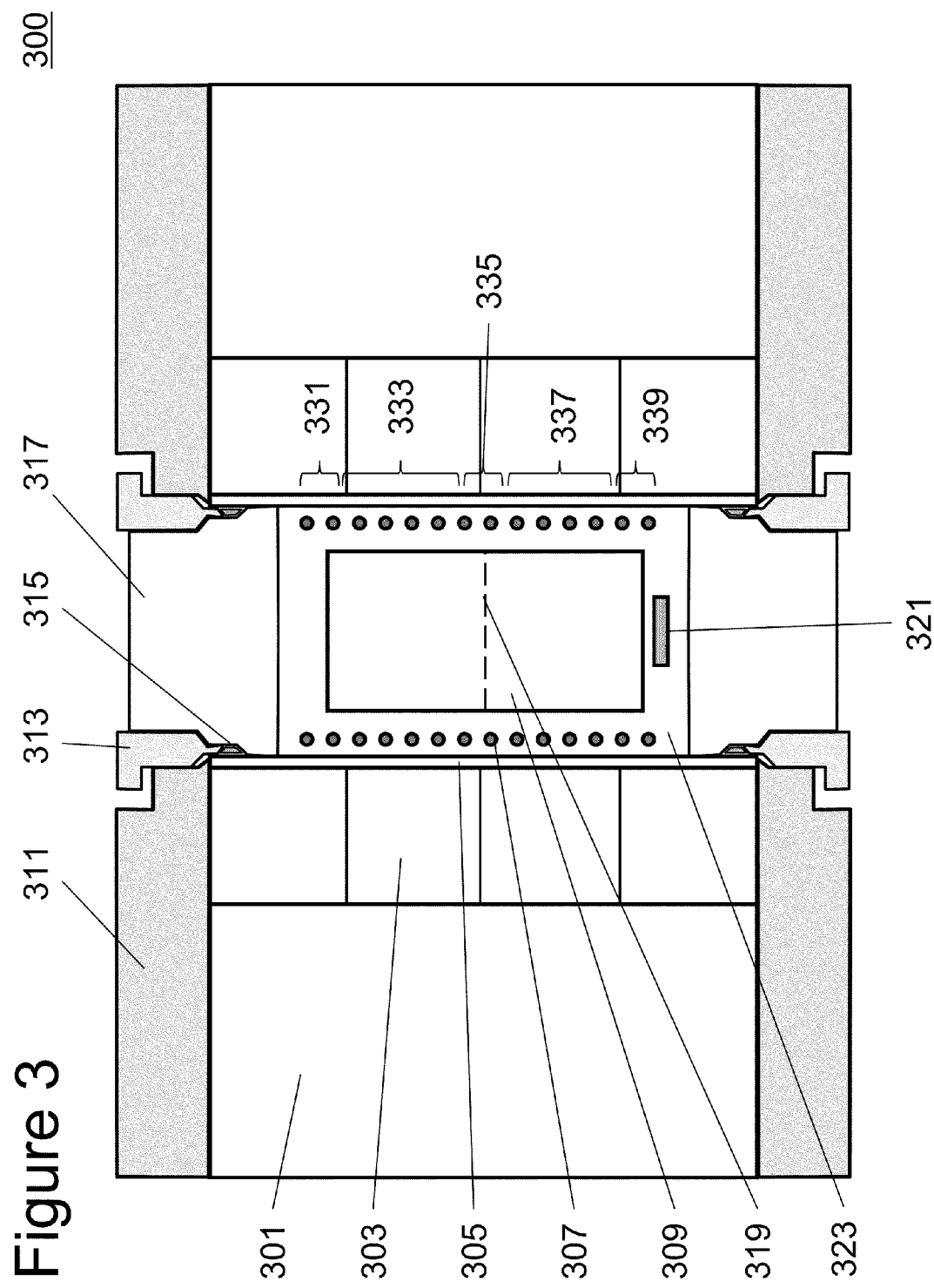
FIG. 3 is an axial view of a high pressure apparatus according to an embodiment of the invention.

FIG. 3 is a simplified diagram of a high pressure apparatus according to an embodiment of the present invention. The apparatus 300 includes a capsule 309, a heating member or heater 307, at least one continuous annular ring or set of radial wedge segments 303, optionally, with one or more scribe marks and/or cracks present. In a specific embodiment, the apparatus optionally has one or more metal sleeves (not shown) containing each continuous annular ring or set of radial wedge segments. The apparatus also has a high-strength enclosure 301, crown plates 311, grand nuts 313, gaskets 315, plungers 317, and displacement transducer 321. Capsule 309 may contain a baffle 319, separating the interior into a nutrient zone and a growth zone. The apparatus may also include additional insulation; for example, between capsule 309 and/or heater 307 and plungers 317 (not shown); feedthroughs through at least one plunger for inlet or exit of pressurized gas, electrical power and/or thermocouples; means for pulling plungers back against gaskets 315 to effect a seal prior to pressurizing; and a power control system (not shown). The apparatus is scalable up to very large volumes and is cost effective. In a specific embodiment, the apparatus is capable of accessing pressures and temperatures of 0.2-2 GPa and 400-1200° C., and includes a temperature controller.

Apparatus 300 includes at least one heat zone, but may have multiple zones. The heat zones include an uppermost first zone 331, a growth zone 333, a baffle zone 335, and a charge or nutrient zone 337, and a lowermost fifth zone 339. In some embodiments the relative positions of the growth and nutrient zones are reversed, so that the nutrient zone is positioned above the baffle zone and the growth zone below the baffle zone. When a capsule 309 is inserted into the volume defined by a heater inner surface, an internal baffle 319 aligns with the baffle zone. The baffle defines two chambers inside the capsule, one for nutrient and one for growth. The two chambers communicate through the perforated baffle, which can have various shapes and configurations. In the illustrated embodiment, appropriate for crystal growth when the solubility of the material to be recrystallized is an increasing function of temperature, the growth zone is located above the nutrient zone. In other embodiments, appropriate for crystal growth when the solubility of the material to be recrystallized is a decreasing function of temperature, i.e., retrograde solubility, the growth zone is located below the nutrient zone. In still other embodiments, apparatus 300 is approximately horizontal rather than vertical and may be fitted with a rocking mechanism (not shown).

Typically, the capsule or liner suitable for insertion or placement inside the heater is formed from a precious metal, such as platinum, palladium, rhodium, gold, or silver. Other metals that can be used include titanium, rhenium, copper, stainless steel, zirconium, tantalum, alloys thereof, and the like. Typically, the metal functions as an oxygen getter. Suitable capsule dimensions may be greater than 2 cm in diameter and 4 cm in length. In one embodiment, the dimension of the diameter is in a range selected from any of: 2-4 cm, 4-8 cm, 8-12 cm, 12-16 cm, 16-20 cm, 20-24 cm, and greater than 24 cm. In a second embodiment, the ratio of the length to diameter of the capsule is greater than 2. In yet another embodiment, the ratio of length to diameter is in a range of any of: 2 to 4, 4 to 6, 6 to 8, 8 to 9, 9 to 10, 10 to 11, 11 to 12, 12 to 14, 14 to 16, 16 to 18, 18 to 20, and greater than 20.

Growth zone 333 volume has approximately twice the charge zone 337 volume. The electrical circuits for each heating element segment are independently controlled to provide flexibility to achieve and maintain a heat deposition profile along the capsule height. A physical discontinuity between the second and third heater segments, from the top, may produce a local dip in temperature near a baffle plate disposed in the capsule and separating the charge zone 337 from the growth zone 333. In an embodiment, the charge zone and the growth zone are approximately isotherms at temperatures that differ from each other. The baffle zone has a temperature gradient over a relatively small distance between the charge zone and the growth zone isotherms. The winding patterns of the heating elements, and the resultant isotherms with minimal temperature gradient spacing there between to minimize or eliminate wall nucleation inside the capsule and in or on the baffle. In an embodiment, the growth zone may be at the bottom and the charge zone at the top. Such configurations may be based on specific chemistries and growth parameters.

With particular reference to FIG. 3, the heater 307 is disposed in an apparatus 300 that includes a vessel or high strength enclosure 301. Attachable to the top end of the vessel is first crown plate 311, and to the bottom end is a second crown plate. The crown plates may be secured to the ends of the high strength enclosure by means of a plurality of fasteners (not shown), or to one another by means of a plurality of fasteners, tie rods, a yoke, or the like. In some embodiments the high strength enclosure 301 comprises a single cylinder. In other embodiments the high strength enclosure comprises two or more coaxial, nested cylinders. In still other embodiments the high strength enclosure comprises a stacked set of rings, as described in U.S. Patent Application Ser. No. 61/246,650, which is hereby incorporated by reference in its entirety. The crown plates, fasteners, and/or tie rods may be fabricated from a material selected from a group consisting of steel, low-carbon steel, SA723 steel, SA266 carbon steel, 4340 steel, A-286 steel, iron based superalloy, 304 stainless steel, 310 stainless steel, 316 stainless steel, 340 stainless steel, 410 stainless steel, and 17-4 precipitation hardened stainless steel. One or more of the components comprising the high strength enclosure, the crown plates, fasteners, and tie rods may undergo a heat treatment operation.

Within the vessel 301, continuous annular ceramic member or set of radial wedge segments 303 lines the vessel inner surface and contacts the outer surface of sleeve 305, whose outer diameter is in turn proximate to the heater 307. Examples of annulus materials include but are not limited to zirconium oxide or zirconia. First and second plungers 317 (only one of which is numbered) are located proximate to the ends of the heater 307 inside the vessel. Additional insulation (not shown) may be provided between heater 307 and plungers 317. The additional insulation may have the form of a porous brick, block, or plug, hollow beads, or wool. The additional insulation may comprise zirconia, alumina, mullite, quartz, or the like.

Grand nuts 313 may have threads on their outer diameters that bear against mating threads in the inner diameters of crown plates 311. A gasket 315 may be positioned between the inner extremity of the grand nuts and the outer portion of a larger-diameter region of plungers 317 to form an unsupported Bridgman seal. Internal pressure may tend to force plungers 317 outward, squeezing gasket 315 between plunger 317, grand nut 313, and sleeve 305, strengthening the seal between the interior and exterior of sleeve 305. Gasket 315 may be fabricated from a softer material than sleeve 305 or plunger 317. In one specific embodiment, gasket 315 is fabricated from a material selected from among copper, copper alloy, brass, nickel, nickel alloy, iron, iron alloy, austenitic stainless steel, or an elastomer such as Buna-N or Viton. A small ring or washer (not shown) may be present between gasket 315 and grand nut 313 to minimize torque on gasket 315 during tightening of grand nut 313. Means for obtaining a tight seal, beyond simply tightening grand nut 313 may be provided, so as to obtain a gas-tight seal prior to pressurizing the interior of the liner or vessel. For example, a plate (not shown) may be attached to the top or outer diameter of plungers 317, and bolts fitting in tapped holes in the plate may be tightened against the outer surfaces of grand nuts 313 in order to move plungers 317 to move outward with respect to grand nuts 313, squeezing gaskets 315. Grand nuts 313 and plunger 317 may be fabricated from a material selected from a group consisting of steel, low-carbon steel, SA723 steel, SA266 carbon steel, 4340 steel, A-286 steel, iron based superalloy, 304 stainless steel, 310 stainless steel, 316 stainless steel, 340 stainless steel, 410 stainless steel, and 17-4 precipitation hardened stainless steel. The grand nuts and plunger components may undergo a heat treatment operation.

FIG. 3 shows an embodiment of the invention in which a gas-tight seal is provided by a modified Bridgman seal. In other embodiments, a gas-tight seal is provided by at least one of a Grayloc™ seal, an o-ring seal, a confined gasket seal, a bolted closure, an AE™ closure, an EZE-Seal™, a Keuntzel closure, a ZipperClave™ closure, a threadless pin closure, or a Gasche™ gasket seal.

Turning now to the control features of the system of FIG. 3, the heat and pressure developing inside the capsule 309 are controlled to ensure a desired temperature distribution inside the capsule 309 and to ensure relatively uniform pressures between the inside of the capsule 309 and the exterior of the capsule 309 in the region of heater 307. In certain embodiments, the capsule 309 is self-pressurizing by heat or chemical reactions, for example, via the equation of state of ammonia or water for crystal growth of gallium nitride or quartz, respectively. For example, the heating elements 307 function to raise the temperature inside the capsule 309, thereby causing the substances disposed within the capsule 309 to expand and, thus, raise the pressure within the capsule 309.

To counteract this internal pressure within the capsule 309, a gas pressure intensifier (not shown) pumps a high-pressure gas, such as argon or another inert gas, through tubing into the interior of sleeve 305 to pressurize the closed/sealed environment 323 surrounding the capsule 309. In the illustrated embodiment, the apparatus 300 of FIG. 3 also comprises one or more sensors, such as displacement sensor 321, which are configured to sense deformation due to a pressure difference between an interior and an exterior of the capsule 309. Displacement sensor 321 may be placed proximate to a surface of capsule 309 and may comprise a capacitance displacement transducer, an inductive displacement transducer, an eddy current sensor a linear variable differential transformer (LVDT), or the like.

The apparatus 300 also includes a pressure control device (not shown) configured to adjust the pressure difference (i.e., reduce, minimize, or eliminate) between the interior of capsule 309 and the closed/sealed environment 323 in response to the pressure difference sensed by the one or more sensors 321. Typically, the pressure ranges from about 1000 bars to about 10000 bars and the temperature ranges from about 300 degrees Celsius to about 1200 degrees Celsius. In other embodiments of the present technique, the pressure ranges to above 10000 bars and the temperature ranges to above 1500 degrees Celsius. The pressure control device is configured to balance an interior pressure within the capsule 309 with an external or surrounding pressure of the pressurized gas within the pressure vessel in response to sensed environmental conditions within the capsule or the pressure vessel. As discussed above, these sensed environmental conditions may include an internal pressure, an exterior pressure, a deformation of the capsule 309, a temperature inside and/or outside of the capsule, and different combinations thereof.

In one embodiment of the illustrated technique, the sensor 321 comprises a displacement measuring device, such as a capacitance displacement transducer, configured to measure displacement or deformation of the capsule 309 due to the expansion or contraction of the capsule 309 due to the difference in pressure between the exterior and the interior of the capsule 309. In another embodiment, at least one of sensors 321 comprises a strain gauge and is configured to measure displacement or deformation of the capsule 309 due to the expansion or contraction of the capsule 309, which expansion or contraction is due to the difference in pressure between the exterior and the interior of the capsule 309. In response to a measured displacement of the capsule 309, the pressure control device adjusts the internal pressure within the capsule 309 and/or the surrounding pressure in closed/sealed environment 323 via the gas pressure intensifier to balance the internal and surrounding pressures, thereby substantially eliminating the pressure difference and preventing further displacement of the capsule 309.

In another embodiment, at least one of pressure sensors 321 comprises a pressure-measuring device, such as a Bourdon gauge, which measures the surrounding pressure within the closed/sealed environment 323 surrounding the capsule 309. In operation, the pressure control device compares this surrounding pressure against the internal pressure within the capsule 309, and then adjusts either the surrounding pressure via the gas pressure intensifier or the internal pressure. However, a variety of sensors are within the scope of the present technique. The pressure control device may comprise software, hardware, or suitable devices to monitor the pressure differences and to control the gas pressure intensifier such that the surrounding pressure within the closed/sealed environment 323 is substantially equal to the pressure inside the capsule 309. In this manner, the capsule 309 can withstand relatively higher internal pressures, thereby facilitating processing of materials with supercritical fluids. In alternative embodiments, the pressure difference may be substantially eliminated or minimized by simultaneously controlling the temperature and pressure in tandem within the capsule 309.

Regarding the control of temperature in the system 300 of FIG. 3, the illustrated apparatus also includes a plurality of temperature sensors situated proximate to, and preferably in direct contact with, the capsule 309 for monitoring the temperature distribution of the capsule 309. In addition, these temperature sensors may be positioned both inside and outside of the capsule 309 to facilitate control of the internal and external/surrounding conditions (e.g., temperature, pressure, etc.) of the capsule 309. The temperature sensors may include a thermocouple, a thermistor, an optical fiber coupled to an optical pyrometer, or any combination thereof. These temperature sensors are coupled to a temperature control device, which monitors and controls the temperature distribution of the capsule 309. In certain embodiments, the temperature control device and the pressure control device cooperate to provide a desired temperature and pressure within the capsule 309 (and optionally surrounding the capsule 309), while ensuring that the pressure differentials between the interior and exterior of the capsule 309 are substantially minimized. Moreover, the temperature sensors may be placed in a plurality of different zones, such as hot zones, around the exterior of the capsule 309, such that the temperature control device can monitor and adjust temperature variations across these different zones. For example, the temperature control device may independently control different elements or portions of the heating elements 307 in response to temperatures sensed in the different zones surrounding the capsule 309, thereby facilitating a balanced or desired temperature profile within the capsule 309. In one embodiment of the present technique, a central controller, computer, control circuitry, or control system may couple the pressure control device and the temperature control device, thereby simultaneously or centrally controlling the temperature and pressure associated with the capsule 309.

In operation of the system 300 of FIG. 3, the temperature control device controls power to one or more of the heating elements 307 to provide a desired temperature profile within the capsule 309 over a desired time period. In other words, the temperature control device may facilitate increasing, decreasing, and constant temperatures throughout different regions or zones within the capsule 309. Thus, the interior of the capsule 309 may have temperatures that are substantially constant or varying by time and position, i.e., X, Y, and Z directions.

For example, at high temperature conditions, the temperature is controlled such that a temperature gradient is established between the nutrient chamber or first chamber 337 and the seed/crystal growing chamber or second chamber 333. The temperature gradient between the two chambers 337 and 333 establishes a natural convection pattern of fluid flow. In the relatively warmer first chamber 337, the nutrient particles partially dissolve to form a solution with a desired concentration of crystalline precursor. The relatively warmer, less-dense fluid from chamber 337 rises through the openings of the baffle 319. In the second chamber 333, the lower temperature leads to supersaturation of the solution of crystalline precursor, thereby causing the crystalline precursor to precipitate on crystal seeds located in the second chamber 333. The cooler, denser fluid from the second chamber 333 sinks into the first chamber 337 and the cycle continues. The temperature gradient between the second chamber 333 and the first chamber 337 significantly controls the growth rate of the crystals. Accordingly, the temperature control device, heating elements 307, and baffle 319 significantly affect the growth of crystals in the capsule 309 by controlling the rate of fluid and heat transfer between the two chambers.

Under these processing conditions, the pressure in the interior of the capsule 309 reaches an elevated pressure when its temperature is raised to a predetermined value by directing electrical power to the heating elements 307. If the equation of state of the material in the capsule 309, that is, the pressure as a function of temperature and fill factor, is accurately known, the pressure within in the high strength enclosure 301 may be ramped in tandem with the increase in temperature so that the gas pressure in the closed/sealed environment 323 is approximately equal to the pressure in the interior of the capsule 309. If this condition is not held, the capsule 309 will be crushed or will burst, depending on whether the exterior pressure exceeds the interior pressure or vice versa. Again, the pressure control device ensures that the pressures inside and outside of the capsule 309 are substantially balanced during a particular process, thereby preventing undesirable deformations of the capsule 309 and facilitating much greater pressure ranges for the particular process.

To protect the capsule 309 from bursting due to over pressure, the pressure control device functions to adjust the pressure in the closed/sealed environment 323. For example, the deformation of the capsule 309 can be measured by the sensor 321, which provides a signal to the pressure control device. In turn, the pressure control device provides signals to the gas pressure intensifier to regulate the flow of gas to the capsule 09, thereby protecting the capsule 309 from bursting. In other words, if the interior pressure begins to exceed the exterior pressure causing the capsule 309 to deform outward, then one or more of the sensors 321 indicates an internal-external pressure difference (or physical displacement/deformation) that triggers pressure adjustment by the pressure control device. For example, the one or more sensors 321 may provide a signal to the pressure control device, which device causes the gas pressure intensifier to increase the exterior gas pressure to minimize or eliminate the internal-external pressure difference. Conversely, if the exterior pressure begins to exceed the interior pressure, causing the capsule 309 to deform inward, then the one or more sensors 321 transmit a signal to the pressure control device, which reduces the exterior gas pressure to minimize or eliminate the internal-external pressure difference. For example, the system may reduce the pumping of the gas pressure intensifier or open a valve (not shown) to release some pressure.

The illustrated apparatus 300 can be used to grow crystals under pressure and temperature conditions desirable for crystal growth, e.g., gallium nitride crystals under related process conditions. The high-pressure apparatus 300 can include one or more structures operable to support the heater 37 radially, axially, or both radially and axially. The support structure in one embodiment thermally insulates the apparatus 300 from the ambient environment, and such insulation may enhance or improve process stability, maintain and control a desired temperature profile.

Figure 4:
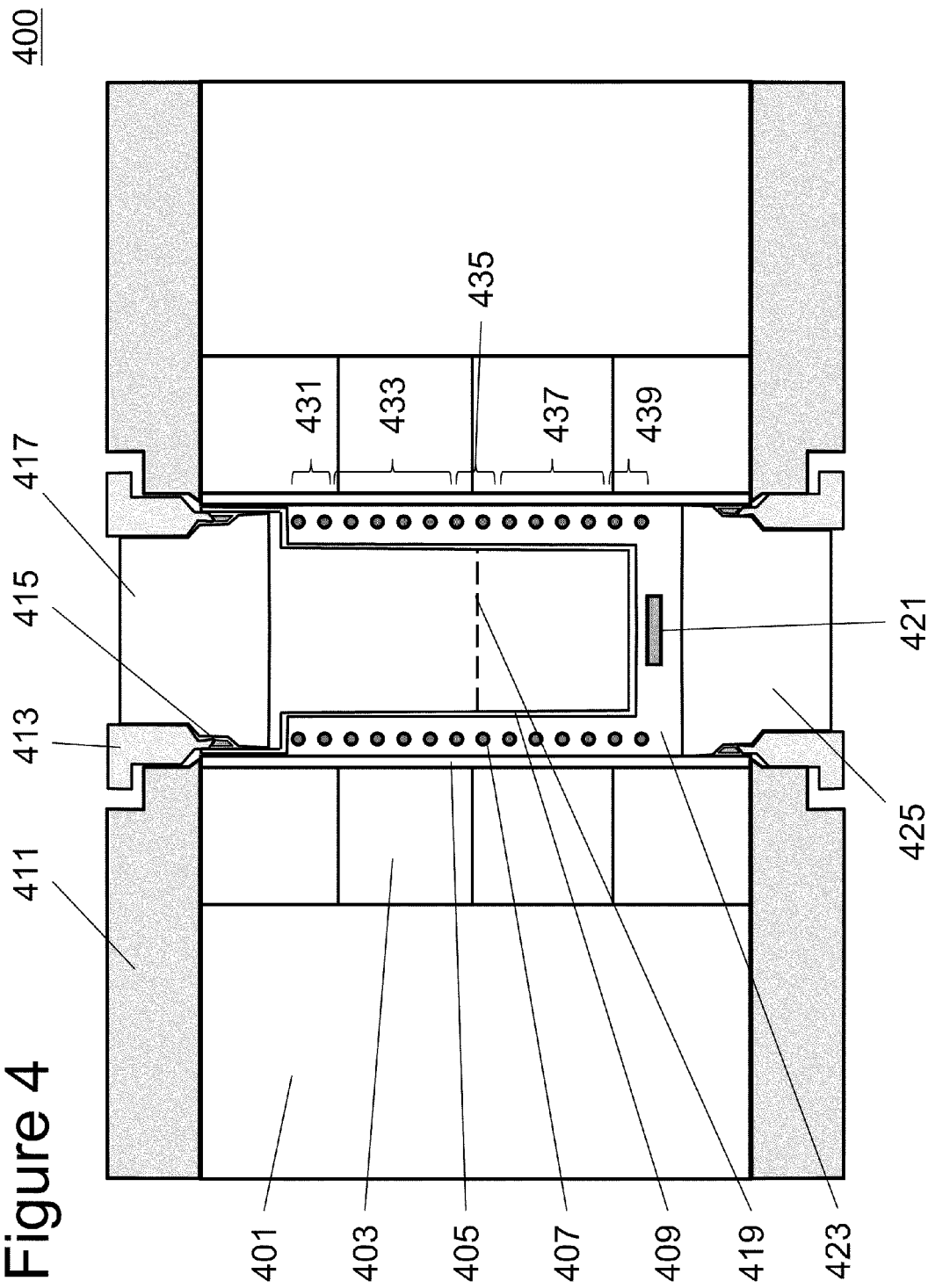
FIG. 4 is an axial view of a high pressure apparatus according to an embodiment of the invention.

Referring to FIG. 4, another embodiment of a high pressure apparatus and related methods for processing supercritical fluids are disclosed. In a specific embodiment, the present apparatus 400 includes a liner 409, a heating member or heater 407, at least one continuous annular ring or set of radial wedge segments 403 but can be multiple rings or sets of radial wedge segments, optionally, with one or more scribe marks and/or cracks present. The apparatus optionally has one or more metal sleeves (not shown) containing each continuous annular ring or set of radial wedge segments. The apparatus also has a high-strength enclosure 401, crown plates 411, grand nuts 413, gaskets 415, top plunger 417, and bottom plunger 425. Apparatus 400 may also include displacement transducer 421. In an alternative embodiment, the interior of liner 409 is connected via a small-diameter hole (not shown) in upper plunger 417 to a pressure transducer (not shown). The pressure within liner 409 may be measured with the latter transducer or sensor, while the pressure in closed space 423 may be measured by another transducer or sensor via a connection through a small-diameter hole in lower plunger 425. Liner 419 may contain a baffle, separating the interior into a nutrient zone and a growth zone. The apparatus may also include additional insulation; for example, between capsule 409 and/or heater 407 and plungers 417 and 425 (not shown); feedthroughs through at least one plunger for inlet or exit of pressurized gas, electrical power and/or thermocouples; means for pulling plungers back against gaskets 415 to effect a seal prior to pressurizing; and a power control system (not shown).

With particular reference to FIG. 4, the heater 407 is disposed in an apparatus 400 that includes a vessel or high strength enclosure 401. Attachable to the top end of the vessel is first crown plate 411, and to the bottom end is a second crown plate. The crown plates may be secured to the ends of the high strength enclosure by means of a plurality of fasteners (not shown), or to one another by means of a plurality of fasteners, tie rods, a yoke, or the like.

Within the vessel 401, continuous annular ceramic member or set of radial wedge segments 403 lines the vessel inner surface and contacts the outer surface of sleeve 405, whose outer diameter is in turn proximate to the heater 407. Examples of annulus materials include but are not limited to zirconium oxide or zirconia. First and second plungers 417 and 425 are located proximate to the ends of the heater 407 inside the vessel. Additional insulation (not shown) may be provided between heater 405 and plungers 417 and 425.

Grand nuts 413 may have threads on their outer diameters that bear against mating threads in the inner diameters of crown plates 411. A gasket 415 may be positioned between the inner extremity of the grand nuts and the outer portion of a larger-diameter region of plungers 417 and 425 to form an unsupported Bridgman seal. Internal pressure may tend to force plungers 417 and 425 outward, squeezing gasket 415 between plunger 417, grand nut 413, and the inner diameter of liner 409, sleeve 305, strengthening the seal between the interior and exterior of liner 409. Gasket 415 may be fabricated from a softer material than liner 409 or plunger 417. In some embodiments, loading of the inner diameter of liner 409 may cause formation of a gas-tight seal with respect to sleeve 405. In some embodiments, an additional gasket may be provided between the outer diameter of liner 409 and the inner diameter of sleeve 405 to provide a gas-tight seal. A small ring or washer (not shown) may be present between gasket 415 and grand nut 413 to minimize torque on gasket 415 during tightening of grand nut 413. Means for obtaining a tight seal, beyond simply tightening grand nut 313 may be provided, so as to obtain a gas-tight seal prior to pressurizing the interior of the liner, sleeve, or vessel. For example, a plate (not shown) may be attached to the top or outer diameter of plungers 417, and bolts fitting in tapped holes in the plate may be tightened against the outer surfaces of grand nuts 413 in order to move plungers 417 and 425 to move outward with respect to grand nuts 413, squeezing gaskets 415.

The composition of liner 409 is chosen so as to be chemically inert with respect to the crystal growth environment contained therein, and to be deformable and hydrogen-impermeable. A coating or lining of similar composition may be placed on the surfaces of upper plunger 417 that are exposed to the crystal growth environment, including the lower surface, the lower portion of the outer perimeter, and the inner diameter of a small-diameter hole that connects the interior of the liner to a pressure transducer, at least one valve, or the like.

Turning now to the control features of the system of FIG. 4, the heat and pressure developing inside the liner 409 are controlled to ensure a desired temperature distribution inside the liner 409 and to ensure relatively uniform pressures between the inside of the liner 409 and the exterior of the liner 409 in the region of heater 407. In certain embodiments, the liner 409 is self-pressurizing by heat or chemical reactions, for example, via the equation of state of ammonia or water for crystal growth of gallium nitride or quartz, respectively. For example, the heating elements 407 function to raise the temperature inside the liner 409, thereby causing the substances disposed within the liner 409 to expand and, thus, raise the pressure within the liner 409.

To counteract this internal pressure within the liner 409, a gas pressure intensifier (not shown) pumps a high-pressure gas, such as argon or another inert gas, through tubing into the interior of sleeve 405 to pressurize the closed/sealed environment 423 surrounding the liner 409. In the illustrated embodiment, the apparatus 400 of FIG. 4 also comprises one or more sensors, such as a pressure sensor (not shown) or displacement sensor 421, which are configured to sense pressure or deformation due to a pressure difference between an interior and an exterior of the liner 409.

The apparatus 400 also includes a pressure control device (not shown) configured to adjust the pressure difference (i.e., reduce, minimize, or eliminate) between the interior of liner 409 and the closed/sealed environment 423 in response to the pressure difference sensed by the one or more sensors. The pressure control device is configured to balance an interior pressure within the liner 409 with an external or surrounding pressure of the pressurized gas within the pressure vessel in response to sensed environmental conditions within the capsule or the pressure vessel. As discussed above, these sensed environmental conditions may include an internal pressure, an exterior pressure, a deformation of the liner 409, a temperature inside and/or outside of the capsule, and different combinations thereof.

In one embodiment of the illustrated technique, a first pressure sensor is connected to the interior of liner 409 by means of a small-diameter hole through upper plunger 417 and measures the pressure of the former, while a second pressure sensor is connected to the interior of closed/sealed environment 421 by means of a small-diameter hole through lower plunger 425 and measures the pressure of the latter. In operation, the pressure control device compares the exterior pressure to the internal pressure within the liner 409, and then adjusts either the surrounding pressure via the gas pressure intensifier or the internal pressure to maintain or restore a balance. The pressure control device may comprise software, hardware, or suitable devices to monitor the pressure differences and to control the gas pressure intensifier such that the surrounding pressure within the closed/sealed environment 423 is substantially equal to the pressure inside the liner 409. In this manner, the liner 409 can withstand relatively higher internal pressures, thereby facilitating processing of materials with supercritical fluids. In alternative embodiments, the pressure difference may be substantially eliminated or minimized by simultaneously controlling the temperature and pressure in tandem within the liner 409.

Regarding the control of temperature in the system 400 of FIG. 4, the illustrated apparatus also includes a plurality of temperature sensors situated proximate to, and preferably in direct contact with, the liner 409 for monitoring the temperature distribution of the liner 409. In addition, these temperature sensors may be positioned both inside and outside of the liner 409 to facilitate control of the internal and external/surrounding conditions (e.g., temperature, pressure, etc.) of the liner 409. These temperature sensors are coupled to a temperature control device, which monitors and controls the temperature distribution of the liner 409. In certain embodiments, the temperature control device and the pressure control device cooperate to provide a desired temperature and pressure within the liner 409 (and optionally surrounding the liner 409), while ensuring that the pressure differentials between the interior and exterior of the liner 409 are substantially minimized. Moreover, the temperature sensors may be placed in a plurality of different zones, such as hot zones, around the exterior of the liner 409, such that the temperature control device can monitor and adjust temperature variations across these different zones. For example, the temperature control device may independently control different elements or portions of the heating elements 407 in response to temperatures sensed in the different zones surrounding the liner 409, thereby facilitating a balanced or desired temperature profile within the liner 409. In one embodiment of the present technique, a central controller, computer, control circuitry, or control system may couple the pressure control device and the temperature control device, thereby simultaneously or centrally controlling the temperature and pressure associated with the liner 409.

Figure 5:
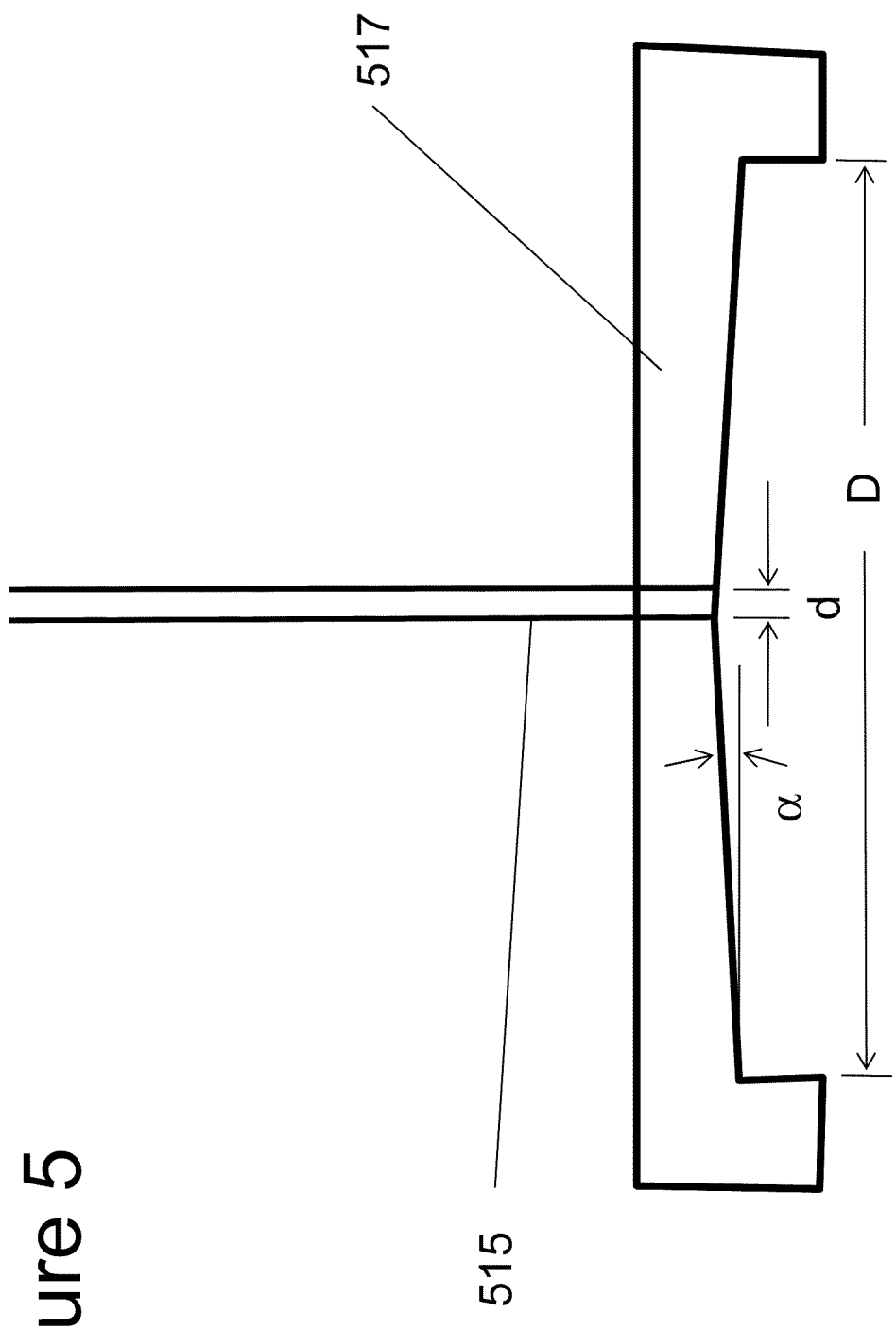
FIG. 5 is a cross-sectional view of a portion of a high pressure apparatus according to an embodiment of the invention.

In embodiments where the interior of liner 409 is accessible, via a small-diameter hole through top plunger 417, to at least one of a valve and a pressure transducer, solvent from the crystal growth environment may access interior surfaces of tubing, fittings, valves, transducers, or the like, potentially resulting in crystal deposition on the surfaces or corrosion of the surfaces and contamination of the crystal growth environment and of the growing crystals. As shown schematically in FIG. 5, the apparatus may contain means for separation of lighter or of heavier components of the supercritical fluid from the principal components and provide protection of the aforementioned surfaces. The lower surface of upper plunger 517 may comprise upward-trending elements that form an angle α from the horizontal that is between about 2 degrees and about 88 degrees, between about 5 degrees and about 75 degrees, or between about 10 degrees and about 50 degrees. Thus, components of the fluid which have a density whose value under operating conditions is between about 1% and about 75% of the density of the principal component of the fluid will tend to separate upwards, similar to a bubble rising to the top of a sealed container of liquid. A small-diameter hole in upper plunger 517 may terminate at or near an uppermost portion of the upward-trending element and be coupled to a fill pipe 515 in such a way that upward trending components of the fluid may pass smoothly into fill pipe 515. The inner diameter d of a portion of fill pipe 515 may be less than 0.5 inch, less than 0.25 inch, less than 0.125 inch, or less than 0.063 inch. Inner diameter D of the upper plunger may be greater than 2 inches, greater than 3 inches, greater than 4 inches, greater than 6 inches, greater than 8 inches, greater than 10 inches, greater than 12 inches, greater than 16 inches, or greater than 24 inches. The ratio d/D may be less than 0.1, less than 0.05, less than 0.025, less than 0.01, or less than 0.005.

In a preferred embodiment of the invention, at least one inert fluid component is added to the liner. An inert fluid component may have a density that is between about 1% and about 75% of the density of the principal component of the solvent fluid or between about 115% and about 5000% of the density of the principal component of the solvent fluid under operating conditions at a predetermined temperature. An inert fluid component may have a solubility for at least one mineralizer component that is less than 10%, less than 1%, or less than 0.1% of the solubility of the mineralizer component in the principal component of the solvent fluid under operating conditions. An inert fluid component may have a solubility for a raw source material that is less than 10%, less than 1%, or less than 0.1% of the solubility of the raw source material in the solution of the mineralizer in the principal solvent component under operating conditions. An inert fluid component may be chemically inert with respect to at least one of the inner diameter of a fill pipe and a valve. Examples of inert fluid components, where ammonia is the principal solvent component, may include H2, He, Ne, N2, Ar, Kr, and Xe. Examples of inert fluid components, where water is the principal solvent component, may include H2, He, Ne, N2, O2, Ar, Kr, and Xe. Further description of the use of inert fluid components in given in U.S. patent application Ser. No. 12/697,126, which is hereby incorporated by reference in its entirety.

In a specific embodiment, the apparatus includes a cylindrical capsule region comprising a first region and a second region, and a length defined between the first region and the second region. A capsule is disposed within the cylindrical capsule region. As an example, the capsule is made of a suitable material that is chemically inert, can withstand pressure, and may also be easy to handle, among other features. Depending upon the embodiment, the capsule is made of a material selected from gold, platinum, silver, or palladium. Of course, there can also be other suitable materials, alloys, coatings, and/or multi-layered structures, depending upon the specific embodiment. Other suitable metals include titanium, rhenium, copper, stainless steel, zirconium, tantalum, alloys thereof, and the like. In a specific embodiment, the capsule is characterized by a deformable material and is substantially chemically inert relative to one or more reactants within the cylindrical capsule region. An example of a capsule is described in U.S. Pat. No. 7,125,453, which is incorporated by reference herein for all purposes.

In a specific embodiment, the apparatus has an annular heating member enclosing the cylindrical capsule or liner region. Another example of a heating member is described in U.S. Patent Application No. 2008/0083741A1, which is also incorporated by reference herein. The heating member may have at least two independently controllable hot zones and may be capable of generating heating power as large as 3 kilowatts, 10 kilowatts, 30 kilowatts, 100 kilowatts, 300 kilowatts, or 1000 kilowatts.

The apparatus has at least one continuous annular ceramic or metal or cermet member 203 disposed continuously around a perimeter of the annular heating member 205. The continuous annular member is made of a material having a compressive strength of about 0.5 GPa and greater and a thermal conductivity of about 4 watts per meter-Kelvin and less. As an example, the ceramic material can comprise rare earth metal oxide, zirconium oxide, hafnium oxide, magnesium oxide, calcium oxide, aluminum oxide, yttrium oxide, sialon (Si—Al—O—N), silicon nitride, silicon oxynitride, garnets, cristobalite, and mullite. The ceramic material may be a composite, comprising more than one phase. Alternatively, as an example, the metal can be a refractory metal such as tungsten, molybdenum, TZM alloy, and others. The cermet can be cobalt-cemented tungsten carbide, and others. In an alternative embodiment, which will be described further below, the continuous annular ceramic, metal, or cermet member is configured to include a plurality of crack regions disposed in a non-symmetrical manner and disposed between an inner diameter of the continuous annular ceramic, metal, or cermet member and an outer diameter of the continuous annular ceramic, metal, or cermet member. In a specific embodiment, the annular member is one of a plurality of members, which are stacked on top of each other.

The apparatus depicted also has a cylindrical sleeve member disposed overlying the at least annular ceramic, metal or cermet member. As an example, the cylindrical sleeve member is made of a material selected from stainless steel, iron, steel, iron alloy, nickel or nickel alloy, or any combinations thereof. In a specific embodiment, the cylindrical sleeve member comprises a first end and a second end.

The first end is characterized by a first outer diameter and the second end is characterized by a second outer diameter, which is less than the first outer diameter, to form a taper angle between an axis of the cylindrical sleeve member and an outer region of the cylindrical sleeve member, the taper angle ranging from about 0.1 to 5 Degrees.

Additionally, the cylindrical sleeve member comprises a substantially constant inner diameter from the first end to the second end according to a specific embodiment, although the inner diameter can also vary depending upon the embodiment. The cylindrical sleeve member is configured to compress the continuous annular ceramic member in cooperation with the high pressure enclosure material, and to provide mechanical support to maintain a specified shape of the continuous annular ceramic member. Preferably, the cylindrical sleeve is configured to compress the continuous annular ceramic member in cooperation with the high pressure enclosure material and to provide mechanical support to maintain a determined shape of the continuous annular ceramic member.

In a specific embodiment, the apparatus has an high strength enclosure material disposed overlying the annular ceramic member. The high strength enclosure is made of a suitable material to house internal contents including capsule, heater, sleeve, among other elements. The high strength enclosure is made of a material selected from a group consisting of steel, low-carbon steel, SA723 steel, SA266 carbon steel, 4340 steel, A-286 steel, iron based superalloy, 304 stainless steel, 310 stainless steel, 316 stainless steel, 340 stainless steel, 410 stainless steel, 17-4 precipitation hardened stainless steel, zirconium and its alloys, titanium and its alloys, and other materials commonly known as Monel, Inconel, Hastelloy, Udimet 500, Stellite, Rene 41, and Rene 88. The high strength enclosure comprises a material with ultimate tensile strength and yield strength characteristics so as to be rated by the American Society of Mechanical Engineers for continuous operation as a pressure vessel at a pressure higher than 50,000 pounds per square inch.

The high strength enclosure has a length and an inner diameter to define an aspect ratio between about 2 to about 25, with a length and an inner diameter defining an aspect ratio of about ten to about twelve. In a specific embodiment, the inner diameter is between about two inches and about fifty inches, and the height of the high strength enclosure is between 6 inches and 500 inches. The ratio between the outer diameter and the inner diameter of the high strength enclosure may be between 1.2 and 5. In a specific embodiment, the diameter ratio may be between about 1.5 and about 3.

FIG. 3 illustrates apparatus 300. Instead of individual radial segments disposed one after another within the apparatus, one or more rings 307 may be stacked within the apparatus. The ring may comprise a ceramic, such as alumina, silicon nitride, silicon carbide, zirconia, or others known to one of ordinary skill in the art. The ring may alternatively comprise a refractory metal, such as tungsten, molybdenum, or TZM alloy, or a cermet, such as Co-cemented tungsten carbide. The ring may have an inner diameter between 0.5 inch and 24 inches, an outer diameter between 1 inch and 48 inches, and a height between 1 inch and 96 inches. In a specific embodiment, the inner diameter is between about 1.5 inches and about 8 inches and the height is between 1.5 inches and 8 inches. The ratio between the outer diameter and the inner diameter of the rings may be between 1.05 and 60. In a specific embodiment, the diameter ratio may be between about 1.5 and about 3. The ring may have a density greater than 95% of theoretical density. The modulus of rupture of the ring material may be greater than 200 or 450 MPa. The fracture toughness of the ring material may be greater than 9 MPa-m½. Depending on the dimensions of the rings and of the high-strength enclosure, one to 200 rings may be stacked on top of one another inside the high-strength enclosure.

A spacer, with a thickness between 0.001 inch and 0.1 inch, may be placed between successive rings in the stack to allow for thermal expansion. A sleeve 309 may be placed around each ring. The sleeve comprises steel or other suitable material. The sleeve may be between 0.020 inch and 0.5 inch thick, and their height may be between 0.25 inch less than that of the ring and 0.1 inch greater than that of the ring depending upon the embodiment. The apparatus also includes a capsule 301, thermocouples 303, which are coupled electrically to temperature controller and/or power controller, a heater 305, a high strength enclosure 311, among other elements.

In a specific embodiment the ceramic rings do not crack significantly under operating conditions, as represented in FIG. 3. The fracture strength of the rings may be higher than the operating pressure of the capsule, for example. In another embodiment, radial compressive loading of the rings is provided by an interference fit with the high strength enclosure. In an embodiment, an interference fit is achieved by at least one of heating of the high strength enclosure and cooling of the ring prior to assembly. In another embodiment, an interference fit is achieved by grinding a slight taper, for example, approximately one degree, on the inner diameter of the high strength enclosure and on the ring and/or the sleeve surrounding the ring, and then pressing the ring and sleeve into the high strength enclosure to achieve the interference fit.

In another embodiment, the rings have at least one crack under operating conditions in the apparatus 400, as shown in FIG. 4. In this embodiment, the rings 407 are inserted into the high strength enclosure and allowed to crack during initial operation. Cracking in particular positions may be facilitated by scribing the inner diameter of the ring at the points of the desired crack initiation. The resulting cracks may run all the way from the inner diameter to the outer diameter, or they may terminate within the volume of the ring and/or have any combinations of these structures. In another embodiment, the rings are cracked prior to insertion into the high strength enclosure. Pre-cracking may be achieved by sliding a precision-turned rod having a larger coefficient of thermal expansion than the ring into the inner diameter of the ring and heating. The sleeve 409 surrounding the ring will keep and maintain all parts of the ring together and precisely oriented with respect to each other in the event that cracks run completely through the ring at various radial positions. In another embodiment, cracks are present within the volume of the ring and contact neither the inner diameter nor the outer diameter of the ring. The apparatus 400 also includes a capsule 401, thermocouples 403, which are coupled electrically to temperature controller and/or power controller, a heater 405, a high strength enclosure 411, among other elements.

The vertical dimension runs out of the page in FIGS. 3 and 4. The top and bottom of the cavity defined by the inner diameter of the rings is terminated by insulating plugs positioned proximate to end flanges, as shown in FIG. 2. The end flanges may be attached to the high strength enclosure by means of bolts. The length-to-diameter ratio of the cavity should be at least 2:1 and more preferably lies in the range between 5:1 and 15:1.

To measure the temperature at various heights on the outer diameter of the capsule, prior to assembly at least one axial dent or groove is placed on the outer diameter of the capsule at specified radial positions. In the examples shown in FIGS. 3 and 4, four dents or grooves are placed 90 degrees apart along the outer diameter of the capsule. The groove or dent may extend the entire height of the capsule or may terminate at the height along the capsule where a temperature measurement is desired. The width and depth of the groove or dent may be between about 0.025 inch and 0.130 inch. Holes slightly larger in diameter than the thermocouple may be placed in one or both end flanges. Holes or grooves may also be placed in at least one insulating cylinder separating the end flange from the capsule. Thermocouples may be inserted into the grooves or dents after insertion of the capsule into the heater, followed by placement of the end flanges onto the high strength enclosure. Alternatively, one or more thermocouples may be inserted into the grooves or dents prior to placement of the end flanges, and the free ends strung through the end flanges prior to placement of the latter and attachment of the electrical connections to the free ends of the thermocouples.

A method according to a specific embodiment is outlined below.

1. Provide an apparatus for high pressure crystal growth or material processing, such as the one described above, but can be others, the apparatus comprising a cylindrical capsule region comprising a first region and a second region, and a length defined between the first region and the second region, an annular heating member enclosing the cylindrical capsule region, a sleeve enclosing the annular heating member, at least one continuous ceramic or annular metal or cermet member or set of radial wedges having a predetermined thickness disposed continuously around the sleeve and an high strength enclosure material disposed overlying the annular ceramic members;

2. Provide a capsule containing a solvent, nutrient, mineralizer, and a plurality of seed crystals, such as at least 5, at least 10, or at least 25;

3. Place the capsule within an interior region of the cylindrical capsule region;

4. Process the capsule with thermal energy to cause an increase in temperature within the capsule to greater than 200 Degrees Celsius to cause the solvent to be superheated;

5. Form a crystalline material from a process of the superheated solvent;

6. Remove thermal energy from the capsule to cause a temperature of the capsule to change from a first temperature to a second temperature, which is lower than the first temperature;

7. Remove a first seal from the high pressure apparatus;

8. Remove the capsule from the cylindrical capsule region;

9. Open the capsule;

10. Remove the crystalline material; and

11. Perform other steps, as desired.

A method according to another specific embodiment is outlined below.

1. Provide an apparatus for high pressure crystal growth or material processing, such as the one described above, but can be others, the apparatus comprising a cylindrical liner comprising a first region and a second region, and a length defined between the first region and the second region, an annular heating member enclosing the liner, a sleeve enclosing the annular heating member, at least one continuous ceramic or annular metal or cermet member or set of radial wedges having a predetermined thickness disposed continuously around the sleeve and an high strength enclosure material disposed overlying the annular ceramic members;

2. Place a baffle, nutrient, mineralizer, and a plurality of seed crystals, such as at least 5, at least 10, or at least 25, within the liner;

3. Provide a gas-tight seal between each of the interior of the liner, the environment of the annular heating member, and the exterior of the apparatus;

4. Evacuate the interior of the liner and the environment of the annular heating member;

5. Fill a predetermined fraction of the interior of the liner with a solvent through a fill-pipe or fill-tube and seal the fill-pipe or fill-tube;

6. Fill the environment of the annular heating member with a predetermined pressure of an inert gas;

7. Process the liner with thermal energy to cause an increase in temperature within the liner to greater than 200 Degrees Celsius to cause the solvent to be superheated;

8. Form a crystalline material from a process of the superheated solvent;

9. Remove thermal energy from the liner to cause a temperature of the liner to change from a first temperature to a second temperature, which is lower than the first temperature;

10. Remove solvent through a fill-pipe or fill-tube;

11. Open the top portion of the apparatus, exposing the interior of the liner;

12. Remove the crystalline material; and

13. Perform other steps, as desired.

FIG. 6 is a simplified flow diagram 600 of an alternative method of processing a material within a supercritical fluid according to an alternative embodiment of the present invention. The method beings with start, at step 601. Then an assembling step 603 is performed. In a specific embodiment, the apparatus has a cylindrical capsule region comprising a first region and a second region, and a length defined between the first region and the second region. The apparatus also has an annular heating member enclosing the cylindrical capsule region and at least one continuous ceramic or annular metal or cermet member having a predetermined thickness disposed continuously around a perimeter of the annular heating member, which are assembled together, step 605. In a specific embodiment, the capsule, heating member, and annular member are inserted into a high strength enclosure material disposed overlying the annular ceramic member.

The method provides a capsule containing a solvent, such as ammonia, for example, which includes a material to be processed, step 607. The capsule is sealed at step 609. Each of the capsule ends are welded and/or brazed to form a sealed capsule structure. The method assembles by placing (step 611) the capsule containing the solvent and starting crystal within an interior region of the cylindrical capsule region. Annular plugs, end caps, and end flanges are placed on to each of the ends of the apparatus, step 613. See, for example, FIG. 2. In a preferred embodiment, each of the end flanges is secured by a fastener or a plurality of fasteners.

Electrical energy (step 617) is then provided to the heating member. The heating member provides thermal energy to the capsule to a predetermined process temperature and pressure, which cause the solvent to be in a supercritical state, by raising the temperature within the capsule to greater than 200 degrees Celsius to cause the solvent to be superheated.

A crystalline material, e.g. gallium containing crystal such as GaN, AlGaN, InGaN forms from the superheated solvent. The capsule is cooled from a first temperature to a second temperature. Once the energy has been removed and temperature reduced to a suitable level, the flanges, which mechanically held at least the capsule in place, are removed. A mechanical member, such as a plunger, hydraulically moves the mechanical member from the first region of the cylindrical capsule region toward the second region to transfer the capsule out of the cylindrical capsule region free from the apparatus. The capsule is then opened and the crystalline material removed.

In some embodiments, the apparatus is used to grow bulk gallium-containing nitride boules, as described in U.S. Patent Application No. 2010/0031875, which is hereby incorporated by reference in its entirety for all purposes. The bulk gallium-containing nitride boules may be sliced into one or wafers by sawing, lapping, polishing, chemical-mechanical polishing, and/or by other methods that are known in the art. The gallium-containing crystal wafers may be used as substrates to form optoelectronic or electronic devices such as: a light emitting diode, a laser diode, a photodetector, an avalanche photodiode, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascode switch, an inner sub-band emitter, a quantum well infrared photodetector, a quantum dot infrared photodetector, a solar cell, and a diode for photoelectrochemical water splitting and hydrogen generation.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. Apparatus for high pressure material processing, the apparatus comprising:
    a cylindrical capsule region including a first region and a second region, having a length between the first region and the second region;
    a heating member enclosing the cylindrical capsule region;
    a sleeve member adapted to form a sealed region enclosing the heating member, the sealed region being characterized by an internal pressure level capable of tightening a contact between the sleeve member and a seal;
    a gas pressure intensifier for pumping gaseous species into the sealed region at a predetermined range of pressure levels;
    at least one annular ceramic member having a predetermined thickness disposed continuously around a perimeter of the sleeve member, the annular member being made of a material having a compressive strength of at least 0.5 GPa and having a thermal conductivity of less than about 4 watts per meter-Kelvin; and
    a high strength enclosure material over the annular ceramic member to form a high strength enclosure.

2. The apparatus of claim 1 further comprising a control module to control an amount of a gaseous species to be pumped into the sealed region by the gas pressure intensifier based.

3. The apparatus of claim 1 further comprising a temperature sensor positioned within the heating member in proximity to the cylindrical capsule region.

4. The apparatus of claim 1 wherein the gaseous species comprises an inert gas.

5. The apparatus of claim 1 further comprising a displacement sensor positioned within the heating member in proximity to the cylindrical capsule region.

6. The apparatus of claim 1 wherein the seal comprises at least one grand nuts.

7. The apparatus of claim 1 wherein the seal and the sleeve member form a Bridgman seal, a modified Bridgman seal, a Grayloc™ seal, an o-ring seal, a confined gasket seal, a bolted closure, an AE™ closure, an EZE-Seal™, a Keuntzel closure, a ZipperClave™ closure, a threadless pin closure, or a Gasche™ gasket seal.

8. The apparatus of claim 1 wherein the cylindrical capsule region comprises a capsule member.

9. The apparatus of claim 1 wherein the cylindrical capsule region comprises a liner member.

10. The apparatus of claim 1 wherein the annular ceramic member comprises a plurality of wedge-shaped radial ceramic members.

11. The apparatus of claim 1 wherein the annular ceramic member comprises a continuous annular ceramic member.

12. The apparatus of claim 1 wherein the cylindrical capsule region comprises a baffle member.

13. The apparatus of claim 1 wherein the seal comprises a plunger, a grand nut, a gasket, or a plug.

14. The apparatus of claim 9, wherein the interior of the liner member is accessible to at least a valve and a pressure transducer.

15. The apparatus of claim 14, further comprising a plunger having an upward-trending element forming an angle a from the horizontal between about 2 degrees and about 88 degrees.

16. A method for operating a high pressure crystal growth apparatus, the method comprising:
    providing an apparatus for high pressure material processing, the apparatus comprising a cylindrical capsule having a first region and a second region, and a length defined between the first region and the second region, an annular heating member enclosing the capsule, a sleeve enclosing the annular heating member having predetermined thickness disposed continuously around the sleeve, and a high strength enclosure material disposed over the annular member;
    placing a baffle, nutrient, mineralizer, and a plurality of seed crystals within the capsule or liner;
    forming a gas-tight seal between each of regions of the cylindrical capsule or liner, the environment of the annular heating member, and the exterior of the apparatus;
    filling a predetermined fraction of the interior of the capsule or liner with a solvent and sealing the capsule or liner;
    filling one or more inert gases into the environment of the annular heating member;
    processing the cylindrical capsule or liner with a thermal energy to cause an increase in temperature within the capsule or liner to greater than 200 Degrees Celsius to cause the solvent to be heat to a superheated state;
    forming a crystalline material from a process of the superheated solvent;
    removing thermal energy from the cylindrical capsule or liner to cause a temperature of the liner to change from a first temperature to a second temperature, the second temperature being lower than the first temperature;
    removing the solvent from the capsule or liner;
    opening a top portion of the apparatus;
    exposing at least one region of the cylindrical capsule or liner; and
    removing the crystalline material.

17. The method of claim 16 wherein the plurality of seed crystals comprises at least 10 seed crystals.

18. The method of claim 16 wherein the annular member comprises one continuous ceramic, annular metal, cermet member, or a set of radial wedge segments.

19. The method of claim 16 further comprising forming the crystalline material into one or more wafers and forming one or more devices on the one or more wafers.

20. The method of claim 19 wherein the one or more devices comprises an optoelectronic or electronic device selected from among a light emitting diode, a laser diode, a photodetector, an avalanche photodiode, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascode switch, an inner sub-band emitter, a quantum well infrared photodetector, a quantum dot infrared photodetector, a solar cell, and a diode for photoelectrochemical water splitting and hydrogen generation.

* * * * *

UNITED STATES PATENT AND TRADEMARK OFFICE
CERTIFICATE OF CORRECTION

| | | |
|---|---|---|
| PATENT NO. | : 8,871,024 B2 | Page 1 of 1 |
| APPLICATION NO. | : 13/013697 | |
| DATED | : October 28, 2014 | |
| INVENTOR(S) | : Mark P. D'Evelyn | |

It is certified that error appears in the above-identified patent and that said Letters Patent is hereby corrected as shown below:

IN THE CLAIMS:

At Column 21, Claim 15, line 26
Please replace "a" with "α" between "angle" and "from" so that the line reads "having an upward-trending element forming an angle α from".

Signed and Sealed this
Seventeenth Day of February, 2015

Michelle K. Lee
*Deputy Director of the United States Patent and Trademark Office*